US006999911B2

(12) United States Patent  
Fujisawa

(10) Patent No.: US 6,999,911 B2  
(45) Date of Patent: *Feb. 14, 2006

(54) METHOD AND APPARATUS FOR CARRYING OUT CIRCUIT SIMULATION

(75) Inventor: Hisanori Fujisawa, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 489 days.

(21) Appl. No.: 09/045,041

(22) Filed: Mar. 20, 1998

(65) Prior Publication Data

US 2001/0011209 A1 Aug. 2, 2001

(30) Foreign Application Priority Data

Jul. 11, 1997 (JP) .................................. 9-186987

(51) Int. Cl.  
G06F 17/50 (2006.01)

(52) U.S. Cl. ............................... 703/14; 703/15; 716/3
(58) Field of Classification Search ........... 395/500.35, 395/500.05; 716/3; 703/14–15  
See application file for complete search history.

(56) References Cited

U.S. PATENT DOCUMENTS

| 4,882,690 | A | * | 11/1989 | Shinsha et al. ................ 716/18 |
| 5,412,785 | A | * | 5/1995 | Skruhak et al. .............. 712/230 |
| 5,473,546 | A | * | 12/1995 | Filseth ............................ 716/8 |
| 5,809,284 | A | * | 9/1998 | Fujisawa ....................... 703/14 |
| 5,872,953 | A | * | 2/1999 | Bailey ...................... 395/500.37 |
| 5,909,374 | A | * | 6/1999 | Matsunaga .............. 395/500.06 |
| 5,960,188 | A | * | 9/1999 | Linke et al. ........... 395/500.35 |
| 6,031,979 | A | * | 2/2000 | Hachiya ......................... 716/7 |

FOREIGN PATENT DOCUMENTS

JP 10-40280 2/1998

OTHER PUBLICATIONS

Kuehlmann et al.; "Equivalence checking using cuts and heaps"; IEEE Proc. 1997 Design Auto. Conf.; pp. 263-268. Jun. 1997.*

Wang et al.; "Restructuring binary decision diagrams based on functional equivalence"; IEEE Design Automation; pp. 261-265. Feb. 1993.*

(Continued)

Primary Examiner—Hugh Jones  
(74) Attorney, Agent, or Firm—Staas & Halsey LLP

(57) ABSTRACT

In a method and apparatus for carrying out circuit simulation which performs circuit simulation on a circuit to be simulated, a plurality of partial circuits to be inspected for equivalence in order to check if they exhibit equivalent operational characteristics are extracted from the circuit to be simulated, and the intensity of the influence of an external terminal of the circuit to be simulated is assessed by tracing paths linking the external terminal and given terminals of the partial circuits. Moreover, based on the configurations of the partial circuits, the connectional relationships of corresponding input terminals of the partial circuits, the operational characteristics of corresponding component elements of the partial circuits, and the intensity of the influence of the external terminal, the plurality of partial circuits are inspected for equivalence in order to detect partial circuits exhibiting equivalence. After the circuit to be simulated is compressed by integrating the partial circuits into one circuit, circuit simulation is carried out.

33 Claims, 14 Drawing Sheets

OTHER PUBLICATIONS

Chakrabarti et al.; "An improved hierarchical test geneation technique for combinational circuits with reptitive sub-circuits"; IEEE Proc. Test Symp.; pp. 237-243, Nov. 1995.*

Yokomizo et al.; "A new circuit recognition and reduction method for pattern based circuit simulation"; IEEE Custom Integrated Cir. Conf.; pp. 9.4/1.9-9.4/4, May 1990.*

* cited by examiner

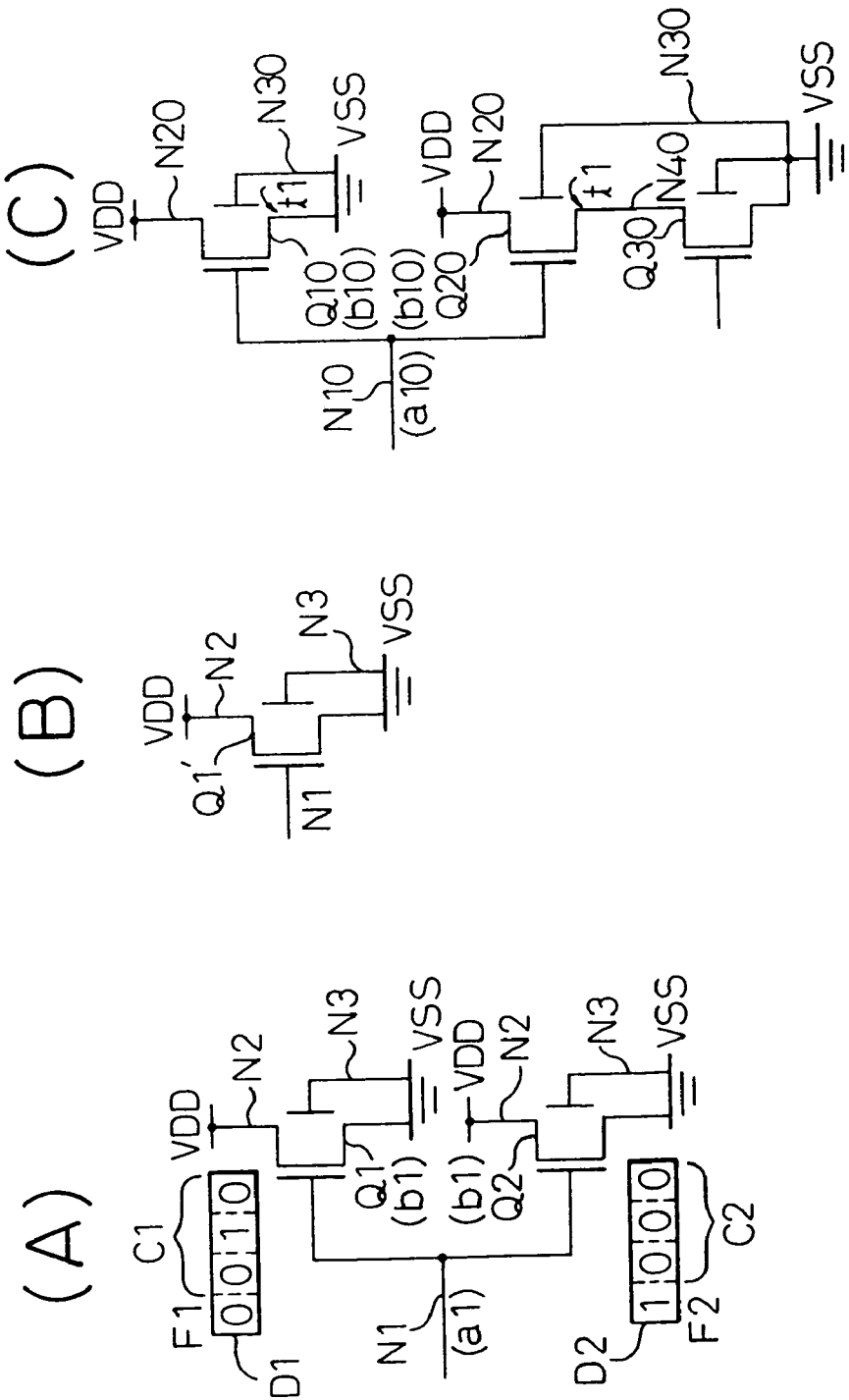

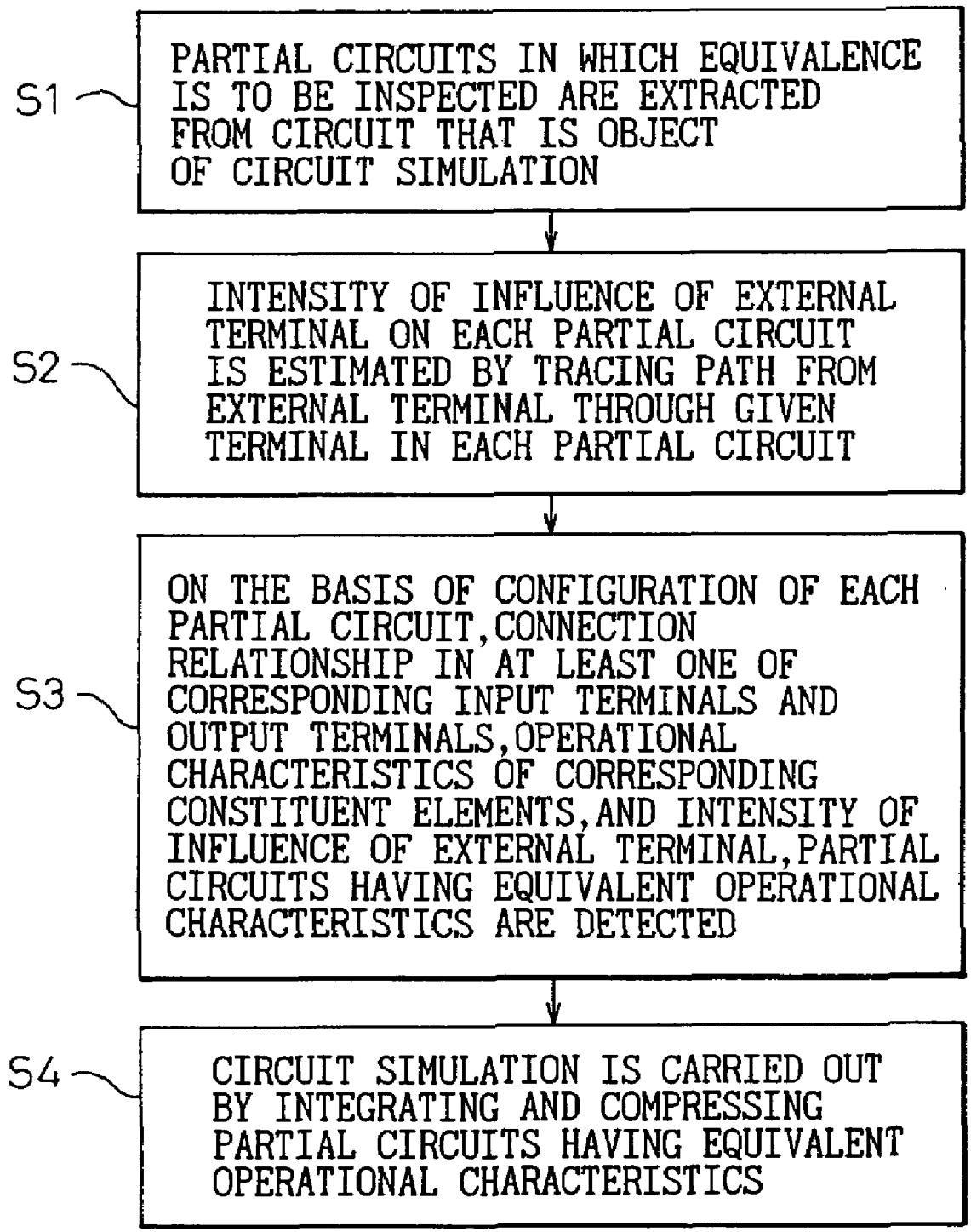

EACH OF FILLED DOTS (●) DENOTES A NODE

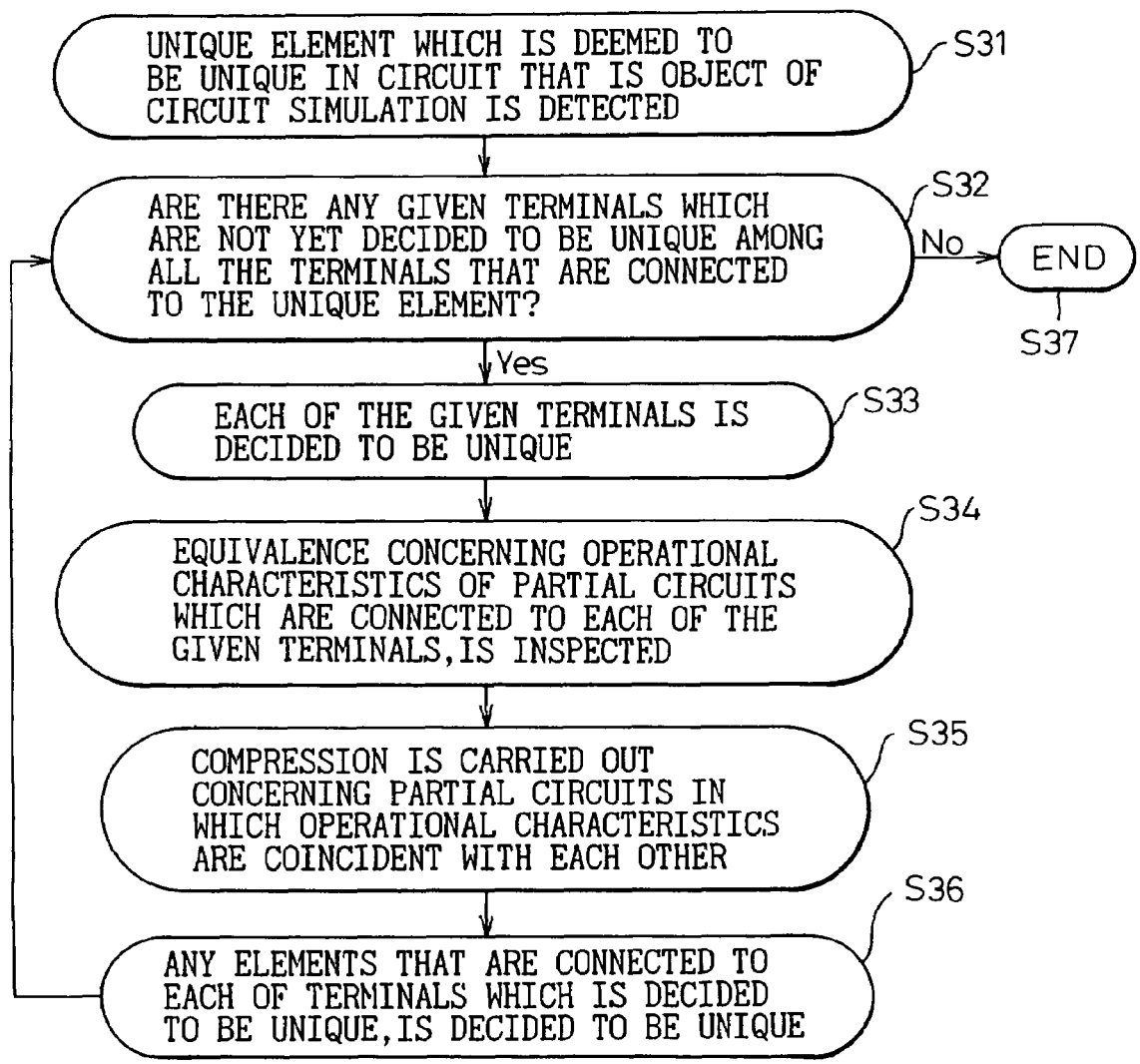

METHOD AND APPARATUS FOR CARRYING OUT CIRCUIT SIMULATION

BACKGROUND OF THE INVENTION

1. Field of the Invention

The present invention relates to a method and apparatus for carrying out circuit simulation which simulates, at high speed, a circuit that is an object of circuit simulation.

In particular, the present invention relates to a circuit simulation technique for simulating and inspecting a MOS large-scale integrated (abbreviated to LSI) circuit, which includes a plurality of MOS semiconductor devices, as an object of circuit simulation, and for thus checking if the MOS LSI circuit satisfies design specifications or for improving the performance of the MOS LSI circuit.

2. Description of the Related Art

For simulating a circuit to be simulated using a circuit simulator or the like, a current flowing into each terminal in the circuit or a voltage at the terminal are calculated on the basis of the connectional relationship of each modeled circuit element in the circuit, the characteristics of the modeled circuit element, and the connectional relationship of an input terminal of the circuit to be simulated. In this case, when the circuit to be simulated is handled as it is and simulated, it takes too much time for the simulation. It is hard to achieve circuit simulation efficiently in a short period of time. In particular, a MOS LSI circuit is large in scale. In the circumstances, it is required that the circuit to be simulated is simplified while the accuracy in operation of the circuit is ensured, and thus the time required for simulation is shortened in order to carry out simulation at high speed.

For a better understanding of the problem lying in a circuit simulation method in accordance with a related art, the circuit simulation method and a circuit to be simulated will be described with reference to FIGS. 1A, 1B and 2 that will be referred to in "Brief Description of the Drawings."

FIGS. 1A and 1B are flowcharts each describing an example of a circuit simulation method in accordance with the related art; and FIG. 2 is a circuit diagram showing a typical example of a circuit to be simulated which will be compressed according to the circuit simulation method described in FIGS. 1A and 1B.

For brevity's sake, a signal delay circuit composed of two n-type MOS (NMOS) transistors as shown in a portion (A) of FIG. 2, and a logic circuit composed of three NMOS transistors as shown in a portion (C) of FIG. 2 will be discussed as the circuit to be simulated. A circuit including one NMOS transistor as shown in a portion (B) of FIG. 2 is, as described later, a compressed form of the signal delay circuit shown in the portion (A) of FIG. 2.

The circuit simulation method shown in FIGS. 1A, 1B and 2 has been disclosed in, for example, the specification of a patent application of the related art (Japanese Patent Application No. 8-198074 filed on Jul. 26, 1996) filed by the same inventor and applicant as those of this application.

In the flowchart of FIG. 1A, first, a net Ni (i is a positive integer) (In the portions (A) and (B) of FIG. 2, i is any one of 1 to 3, and in the portion (C) thereof, i is any one of 10, 20, 30, and 40) within a circuit to be simulated, for example, a net N1 in the portion (A) of FIG. 2 is selected (step S200). An identification number marking a net concerned is assigned to the net Ni, for example, net N1. That is to say, an identification number a1 is assigned to the net N1 (step S210).

At step S220 shown in FIG. 1A, circuit elements interconnected within the net Ni and exhibiting the same characteristics (identical circuit elements) are inspected. What is referred to as identical circuit elements are circuit elements exhibiting the same characteristics such as NMOS transistors or p-type MOS (PMOS) transistors that are active circuit elements to be operated with power supplied from a source power supply VSS and drain power supply VDD, capacitors that are passive circuit elements, resistors, and diodes. That is to say, the identical circuit elements are circuit elements exhibiting mutually equivalent operational characteristics. For example, an NMOS transistor Q1 and NMOS transistor Q2 shown in the portion (A) of FIG. 2 are regarded as identical circuit elements.

If a plurality of identical circuit elements are detected at step S230, control is passed to step S240. Otherwise, control is passed to step S290. At step S240, the same identification number is assigned to the identical circuit elements detected at step S220. For example, an identification number b1 is assigned to both the NMOS transistor Q1 and NMOS transistor Q2 (step S240).

As shown in FIG. 1B, it is checked if corresponding terminals of the thus detected identical circuit elements exhibit the same characteristics (step S245). For example, in the portion (A) of FIG. 2, it is checked if the electrical conditions for connection of the source, drain, and bulk resistor of the NMOS transistor Q1 are the same as those of the source, drain, and bulk resistor of the NMOS transistor Q2 (step 250).

Further, in FIG. 1B, if the thus inspected corresponding terminals exhibit the same characteristics, control is passed to step S260. Otherwise, control is passed to step S280.

At step S260 shown in FIG. 1B, m (m is a positive integer equal to or larger than 2) circuit elements and terminals thereof exhibiting the same characteristics are integrated into one circuit element and terminals thereof. For example, the circuit elements shown in the portion (A) of FIG. 2 are integrated into the circuit element shown in the portion (B) thereof. Converting a circuit composed of a plurality of circuit elements and a plurality of terminals into a circuit having one simple circuit element and terminals is referred to as circuit compression.

For compressing the circuit shown in the portion (A) of FIG. 2 into the circuit shown in the portion (B) thereof, the characteristics of an NMOS transistor Q1' must be determined so that a current flowing through the terminals of the NMOS transistor Q1' (refer to the portion (B) of FIG. 2) will be twice as large as a current flowing through the terminals of the NMOS transistor Q1 that has not been integrated (refer to the portion (A) of FIG. 2). In other words, the parameters of the circuit element are determined so that the gate capacitance and drain current of the NMOS transistor Q1' will be twice as large as those of the NMOS transistor Q1.

As a result of inspecting terminals to which the same identification number has been assigned, if it is recognized at step S280 that the terminals are not identical to each other, the identification number is released (for example, the identification number b1 assigned to the NMOS transistors Q1 and Q2 shown in the portion (A) of FIG. 2 is released). The control flow is then returned to step S220. Regarding circuit elements and terminals having identification numbers assigned thereto, circuit elements and terminals having the same identification number can be judged to exhibit the same characteristics. Repetition of a sequence for judging if circuit elements exhibit the same characteristics can be avoided.

Regarding an NMOS transistor Q10 and NMOS transistor Q20 in the logic circuit shown in the portion (C) of FIG. 2 which have been judged as identical circuit elements according to the same procedure adopted to inspect the circuit elements shown in the portion (A) of FIG. 2 and to which the same identification number b10 has been assigned, the drains thereof are connected to the nets N20, and the bulk resistors thereof are connected to the nets N30. However, the source of the NMOS transistor Q10 is connected to the net N30, while the source of the NMOS transistor Q20 is connected to the net N40. The sources of the NMOS transistor Q10 and NMOS transistor Q20 must be inspected in order to check if they exhibit the same characteristics, even though the same identification number t1 has already been assigned to the sources.

For inspecting the sources of the NMOS transistor Q10 and NMOS transistor Q20 to check if they exhibit the same characteristics, the circuit elements connected to the sources that are corresponding terminals are inspected in order to check if they exhibit the same characteristics. In the case of the portion (C) of FIG. 2, the source of the NMOS transistor Q10 is connected to a source power supply VSS, while the source of the NMOS transistor Q20 is connected to the drain of the NMOS transistor Q30. It is therefore judged that the source of the NMOS transistor Q10 and the source of the NMOS transistor Q20 do not exhibit the same characteristics. In this case, the same identification number t1 assigned to the sources is released at step S280.

According to the circuit simulation method of the related art described in conjunction with FIGS. 1A, 1B and 2, circuit simulation is carried out by compressing a circuit that includes circuit elements that have been verified to exhibit the same characteristics as a result of inspecting the circuit elements to check if they exhibit the same characteristics (that is, if the operational characteristics thereof are equivalent to each other) on the basis of the connectional relationship of an input terminal of the circuit to be simulated, the configuration of the circuit to be simulated, and the operational characteristics of the plurality of corresponding circuit elements.

However, according to the circuit simulation method of the related art, as described in conjunction with FIGS. 1A, 1B and 2, when the operations of a circuit to be simulated such as a MOS LSI circuit are inspected, a plurality of circuit elements that have been judged to exhibit the same characteristics are finally inspected for equivalence in operational characteristics merely by inspecting circuit elements connected to corresponding terminals of the plurality of circuit elements to see if they exhibit the same characteristics.

As mentioned above, according to the circuit simulation method of the related art, only circuit elements located in a limited area within a circuit can be inspected in order to see if they exhibit the same characteristics. It is difficult to distinguish all circuit elements exhibiting equivalent operational characteristics in a circuit to be simulated. The circuit is therefore not compressed effectively.

The total number of circuit elements increases with an increase in scale of a circuit to be simulated. The time required for simulation therefore increases. This causes the problem in that it is hard to achieve circuit simulation at high speed.

SUMMARY OF THE INVENTION

The present invention attempts to solve the foregoing problems. An object of the present invention is to provide a method and apparatus for carrying out circuit simulation in which, when especially a large-scale circuit such as a MOS LSI circuit is selected as an object of simulation, the time required for simulation can be shortened drastically, and therefore high-speed simulation can be realized.

For solving the aforesaid problem, a method for carrying out circuit simulation in accordance with the present invention is such that: a plurality of partial circuits to be inspected for equivalence in order to check if they exhibit equivalent operational characteristics are extracted from a circuit that is an object of circuit simulation; the intensity of the influence of an external terminal of the circuit is assessed, by tracing paths linking the external terminal and given terminals of the plurality of partial circuits; based on the configurations of the plurality of partial circuits, the connectional relationships of at least ones of the corresponding input terminals and the output terminals of the plurality of partial circuits, the operational characteristics of corresponding component elements of the plurality of partial circuits, and the intensity of the influence of the external terminal, the plurality of partial circuits are inspected for equivalence in order to detect partial circuits exhibiting equivalent operational characteristics; and after the circuit is compressed by integrating the partial circuits exhibiting the equivalent operational characteristics into one circuit, circuit simulation is carried out.

Preferably, in a method for carrying out circuit simulation in accordance with the present invention, when the circuit is a MOS circuit including a plurality of MOS semiconductor devices, the frequency of shifting from the source or drain of a MOS semiconductor device to the gate thereof while tracing a path linking the external terminal and a given terminal of each of the plurality of partial circuits is assessed as the intensity of the influence of the external terminal.

More preferably, in a method for carrying out circuit simulation in accordance with the present invention, when the connectional relationships of at least ones of the corresponding input terminals and output terminals of the plurality of partial circuits to be inspected for equivalence are judged to be mutually inconsistent, a plurality of other partial circuits connected to at least ones of the input terminals and output terminals are inspected for quasi-equivalence. When the plurality of other partial circuits are judged as quasi-equivalent circuits, the plurality of partial circuits to be inspected for equivalence are regarded to exhibit equivalent operational characteristics.

More preferably, in a method for carrying out circuit simulation in accordance with the present invention, when a plurality of partial circuits are inspected for equivalence, a unique element having no counterpart within the circuit is detected. If a terminal that has not been judged as a unique terminal having no counterpart is included in terminals connected to the unique element, the terminal is newly judged as a unique terminal. The plurality of partial circuits connected to the newly judged unique terminal are inspected for equivalence.

An apparatus for carrying out circuit simulation in accordance with the present invention includes a circuit extracting unit for extracting a plurality of partial circuits, which will be inspected for equivalence in order to check if they exhibit equivalent operational characteristics, from a circuit that is an object of circuit simulation; a storage unit for holding data concerning the configurations of the plurality of partial circuits, the connectional relationships of at least ones of the corresponding input terminals and output terminals of the plurality of partial circuits, and the operational characteristics of corresponding component elements of the plurality of partial circuits; an assessing unit for assessing the intensity of influence of an external terminal of the circuit, by tracing paths linking the external terminal and given terminals of the plurality of partial circuits; and a circuit-equivalence inspecting circuit for detecting partial circuits exhibiting equivalent operational characteristics by inspecting the plurality of partial circuits for equivalence, on the basis of the results of assessment concerning the intensity of the influence of the external terminal provided by the assessing unit and the data held by the storage unit. Herein, after the circuit is compressed by integrating the partial circuits exhibiting the equivalent operational characteristics into one circuit, circuit simulation is carried out.

Preferably, in an apparatus for carrying out circuit simulation in accordance with the present invention, when the circuit is a MOS circuit including a plurality of MOS semiconductor devices, the assessing unit assesses, as the intensity of the influence of the external terminal, the frequency of shifting from the source or drain of a MOS semiconductor device to the gate thereof while tracing a path linking the external terminal to a given terminal of each of the plurality of partial circuits.

Preferably, an apparatus for carrying out circuit simulation in accordance with the present invention further comprises a connected-circuit quasi-equivalence inspecting unit for, when the connectional relationships of at least ones of the corresponding input terminals and output terminals of the plurality of partial circuits to be inspected for equivalence are judged to be mutually inconsistent, inspecting for quasi-equivalence a plurality of other partial circuits connected to at least ones of the input terminals and output terminals. When the connected-circuit quasi-equivalence inspecting unit judges that the plurality of other partial circuits are quasi-equivalent circuits, the plurality of partial circuits to be inspected for equivalence are regarded to exhibit equivalent operational characteristics.

More preferably, in an apparatus for carrying out circuit simulation in accordance with the present invention, when the circuit-equivalence inspecting circuit inspects a plurality of partial circuits for equivalence, it detects a unique element having no counterpart within the circuit. When a terminal that has not been judged as a unique terminal having no counterpart is included in terminals connected to the unique element, the terminal is newly judged as a unique terminal. The plurality of partial circuits connected to the newly judged unique terminal are inspected for equivalence.

According to a method or apparatus for carrying out circuit simulation in accordance with the present invention, the intensity of the influence to be assessed as the frequency of shifting from the source or drain of a MOS semiconductor device to the gate thereof in the course of tracing a path linking an external terminal of extracted partial circuits to an object terminal is taken into account in order to inspect the partial circuits for equivalence. Integrating a plurality of partial circuits into one circuit, which cannot be achieved according to a known technique, can be achieved readily. As a result, a circuit to be simulated can be compressed more effectively. Consequently, the scale of the circuit to be simulated gets smaller. Eventually, circuit simulation can be executed at relatively high speed.

BRIEF DESCRIPTION OF THE DRAWINGS

The above object and features of the present invention will be more apparent from the following description of the preferred embodiments with reference to the accompanying drawings, wherein:

FIG. 2 is a circuit diagram showing a typical example of a circuit to be simulated which will be compressed according to the circuit simulation method described in FIG. 1;

FIG. 3 is a flowchart for explaining a method for carrying out circuit simulation in accordance with a fundamental embodiment of the present invention based on the principle of the present invention;

FIG. 14 is a flowchart describing an algorithm, according to which an element and terminal are inspected for uniqueness, employed in the method for carrying out circuit simulation in accordance with the preferred embodiment of the present invention.

DESCRIPTION OF THE PREFERRED EMBODIMENTS

Figure 1A:
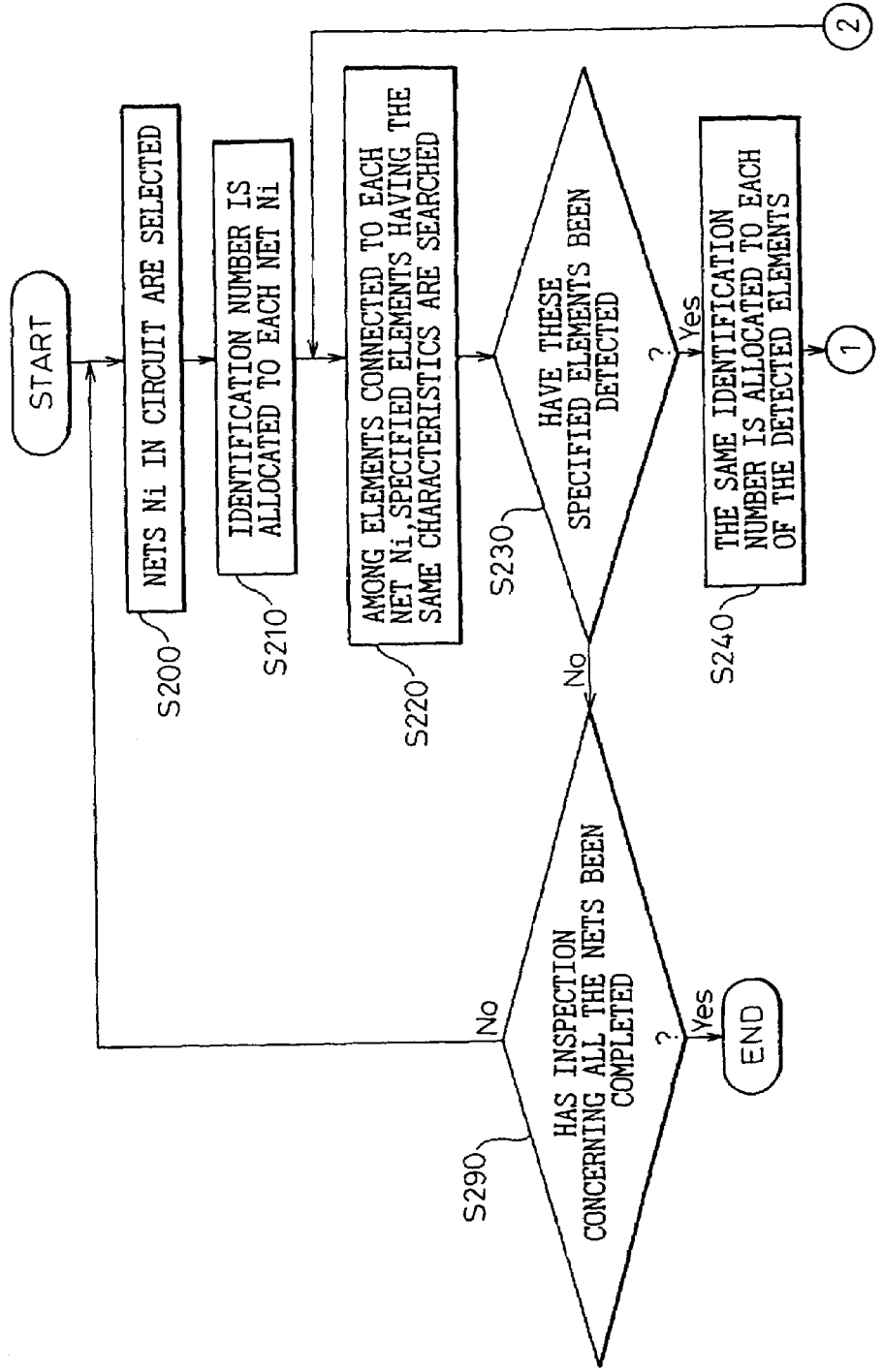
FIGS. 1A and 1B are flowcharts each for explaining an example of a circuit simulation method in accordance with the related art.
Figure 1B:
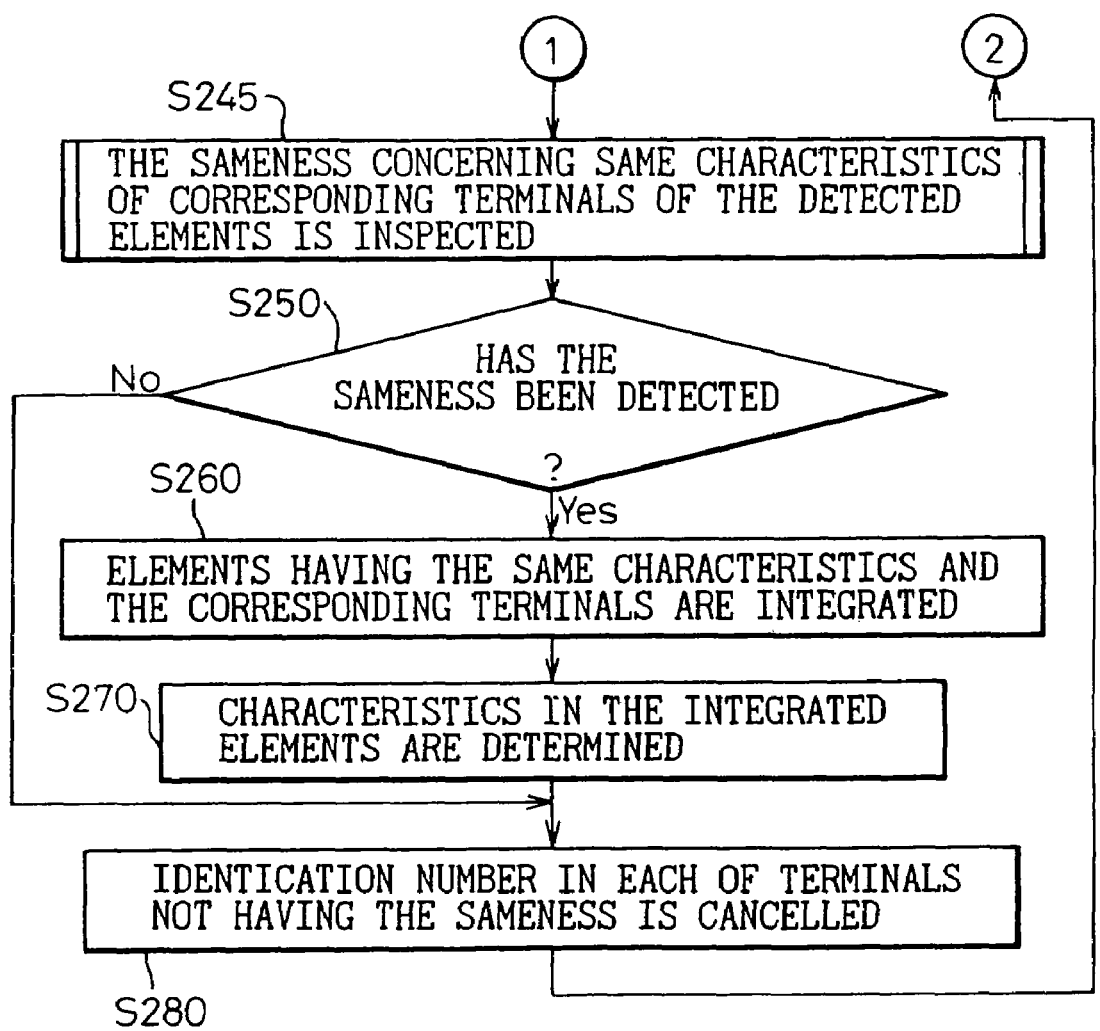

Referring to the appended drawings of FIGS. 3 to 14, the fundamental embodiment and preferred embodiment of the present invention will be described.

FIG. 3 is a flowchart for explaining a method for carrying out circuit simulation in accordance with the fundamental embodiment of the present invention based on the principle of the present invention.

According to the method for carrying out circuit simulation in accordance with the fundamental embodiment of the present invention based on the principle of the present invention, a plurality of partial circuits to be inspected for equivalence in order to check if they exhibit equivalent operational characteristics are extracted from a circuit that is an object of circuit simulation (that is, a circuit to be simulated) (step S1). The intensity of the influence of an external terminal of the circuit to be simulated is assessed by tracing paths linking the external terminal and given terminals of the plurality of partial circuits (step S2). Based on the configurations of the plurality of partial circuits, the connectional relationships of at least ones of the corresponding input terminals and output terminals of the plurality of partial circuits, the operational characteristics of corresponding component elements (that is, circuit elements) of the plurality of partial circuits, and the intensity of the influence of the external terminal, the plurality of partial circuits are inspected for equivalence in order to detect partial circuits exhibiting equivalent operational characteristics (step S3). After the circuit to be simulated is compressed by integrating the partial circuits exhibiting the equivalent operational characteristics into one circuit, circuit simulation is carried out (step S4).

Preferably, according to a method for carrying out circuit simulation in accordance with the fundamental embodiment of the present invention, when the circuit is a MOS circuit including a plurality of MOS semiconductor devices, the frequency of shifting from the source or drain of a MOS semiconductor device toward the gate thereof while tracing a path linking the external terminal and a given terminal of each of the plurality of partial circuits is assessed as the intensity of influence of the external terminal.

More preferably, according to a method for carrying out circuit simulation in accordance with the fundamental embodiment of the present invention, when the connectional relationships of at least ones of the corresponding input terminals and output terminals of the plurality of partial circuits to be inspected for equivalence are judged to be mutually inconsistent, a plurality of other partial circuits connected to at least ones of the input terminals and output terminals are inspected for quasi-equivalence. When the plurality of other partial circuits are judged as quasi-equivalent circuits, the plurality of partial circuits to be inspected for equivalence are regarded to exhibit equivalent operational characteristics.

More preferably, according to a method for carrying out circuit simulation in accordance with the fundamental embodiment of the present invention, when the plurality of partial circuits are inspected for equivalence, a unique element having no counterpart within the circuit is detected. When a terminal that has not been judged as a unique terminal having no counterpart is included in terminals connected to the unique element, the terminal is newly judged as a unique terminal. A plurality of partial circuits connected to the newly judged unique terminal are inspected for equivalence.

Figure 4:
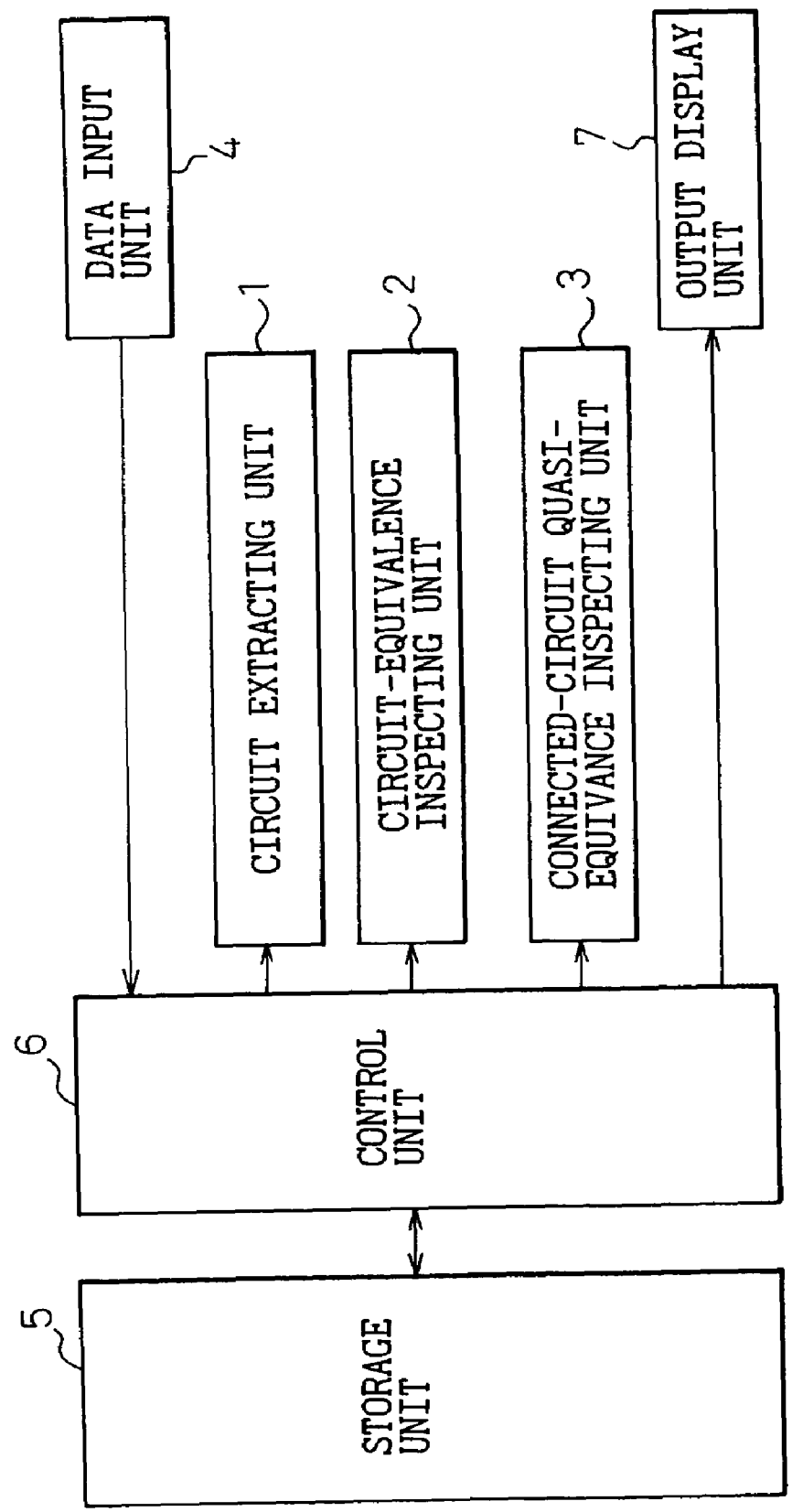
FIG. 4 is a block diagram showing the configuration of an apparatus for carrying out circuit simulation in accordance with the fundamental embodiment of the present invention based on the principle of the present invention.

FIG. 4 is a block diagram showing the configuration of an apparatus for carrying out circuit simulation in accordance with the fundamental embodiment of the present invention based on the principle of the present invention. For brevity's sake, the configuration of an apparatus for carrying out circuit simulation including a circuit simulator is shown schematically.

The apparatus for carrying out circuit simulation in accordance with the present invention comprises: as shown in the block diagram of FIG. 4, a circuit extracting unit 1 for extracting a plurality of partial circuits, which will be inspected for equivalence in order to check if they exhibit equivalent operational characteristics, from a circuit that is an object of circuit simulation (that is, a circuit to be simulated); and a storage unit 5 for holding data concerning the configurations of the plurality of partial circuits, the connectional relationships of at least ones of the corresponding input terminals and output terminals of the plurality of partial circuits, and the operational characteristics of corresponding component elements (that is, circuit elements) of the plurality of partial circuits. The storage unit 5 has the ability to hold a prescribed value concerning quasi-equivalent circuits and the results of equivalence inspection.

Furthermore, the apparatus for carrying out circuit simulation in accordance with the fundamental embodiment of the present invention shown in FIG. 4 comprises: an assessing unit for assessing the intensity of influence of an external terminal of the circuit by tracing paths linking the external terminal and given terminals of the plurality of partial circuits; and a circuit-equivalence inspecting circuit 2 for detecting partial circuits exhibiting equivalent operational characteristics by inspecting the plurality of partial circuits for equivalence on the basis of the results of assessment concerning the intensities of influence of the external terminal provided by the assessing unit and the data held by the storage unit 5. After the circuit is compressed by integrating the partial circuits exhibiting the equivalent operational characteristics into one circuit, circuit simulation is carried out.

Preferably, the assessing unit is realized by a control unit 6 including a CPU and connected to the storage unit 5, circuit extracting unit 1, and circuit-equivalence inspecting circuit 2. The control unit 6 also controls various data streams and judges from the results of equivalence inspection performed by the circuit-equivalence inspecting circuit 2 whether or not partial circuits exhibit equivalent operational characteristics.

Furthermore, the apparatus for carrying out circuit simulation in accordance with the fundamental embodiment of the present invention shown in FIG. 4 comprises a data input unit 4 connected to the control unit 6. The data input unit 4 has the ability to input data concerning the configurations of a plurality of partial circuits, the connectional relationships of at least ones of the corresponding input terminals and output terminals of the plurality of partial circuits, the operational characteristics of corresponding component elements of the plurality of partial circuits, and a prescribed value concerning quasi-equivalent circuits to the control unit 6. Moreover, the apparatus for carrying out circuit simulation shown in FIG. 4 comprises an output display unit 7 for displaying the results of inspecting the plurality of partial circuits for equivalence.

Preferably, when the circuit is a MOS circuit including a plurality of MOS semiconductor devices, the assessing unit assesses, as the intensity of the influence of the external terminal, the frequency of shifting from the source or drain of a MOS semiconductor device toward the gate thereof while tracing a path linking an external terminal and a given terminal of each of the plurality of partial circuits.

Furthermore, preferably, the apparatus for carrying out circuit simulation in accordance with the fundamental embodiment of the present invention shown in FIG. 4 comprises a connected-circuit quasi-equivalence inspecting unit 3 connected to the control unit 6. When the circuit-equivalence inspecting circuit 2 judges that the connectional relationships of at least ones of corresponding input terminals and output terminals of the plurality of partial circuits to be inspected for equivalence are mutually inconsistent, the connected-circuit quasi-equivalence inspecting unit 3 inspects a plurality of other partial circuits connected to at least ones of the input terminals and output terminals for quasi-equivalence. In this case, when the connected-circuit quasi-equivalence inspecting unit 3 judges that the plurality of other partial circuits are quasi-equivalent circuits, the plurality of partial circuits to be inspected for equivalence are regarded to exhibit equivalent operational characteristics.

Furthermore, preferably, in the apparatus for carrying out circuit simulation in accordance with the fundamental embodiment of the present invention shown in FIG. 4, when the circuit-equivalence inspecting circuit 2 inspects a plurality of partial circuits for equivalence, it detects a unique element having no counterpart within the circuit. When a terminal that has not been judged as a unique terminal having no counterpart is included in terminals connected to the unique element, the terminal is newly judged as a unique terminal. A plurality of partial circuits connected to the newly judged unique terminal are inspected for equivalence.

For carrying out simulation using the apparatus for carrying out circuit simulation, first, partial circuits exhibiting the same operational characteristics are distinguished in a circuit to be simulated such as a MOS LSI circuit. For distinguishing partial circuits, the intensity of the influence of an external terminal of the extracted partial circuits upon the extracted partial circuits is taken into account. The intensity of the influence of the external terminal is assessed as the frequency of shifting from the source or drain of a MOS semiconductor device (for example, MOS transistor) to the gate thereof in the course of tracing a path linking the external terminals and an object terminal. When a plurality of partial circuits are inspected for equivalence, even if the connected states of corresponding external terminals of two partial circuits are mutually inconsistent, as long as the intensities of currents flowing from the external terminals placed in the inconsistent connected states are equal to or larger than a designated value, it is regarded that the influence of the external terminals is negligible. Consequently, the partial circuits are judged to exhibit equivalent operational characteristics.

For inspecting partial circuits for equivalence through comparison, the uniqueness of an element and terminal is detected, or in other words, it is detected that an element and terminal has no counterpart, that is, that one partial circuit has no counterpart capable of being compressed. In short, a partial circuit including an element that is confirmed to be unique has no counterpart exhibiting equivalent operational characteristics. Consequently, when partial circuits are inspected for equivalence through comparison, partial circuits other than a partial circuit including an element that is confirmed to be unique should merely be inspected.

When the apparatus for carrying out circuit simulation shown in FIG. 4 is used to carry out circuit simulation, partial circuits exhibiting equivalent operational characteristics, which are detected by the circuit-equivalence inspecting circuit 2, are integrated into one circuit and analyzed for operational characteristics. For analyzing partial circuits for operational characteristics, partial circuits integrated into one circuit are, in principle, analyzed by carrying out the same calculation as the one used to analyze partial circuits that are not integrated. The processing described below is performed on circuit elements located on the border between partial circuits to be integrated.

When circuit elements of partial circuits to be integrated are connected to the same terminal, a value indicating an operational characteristic of the terminal is multiplied by the number of partial circuits to be integrated. When circuit elements of partial circuits to be integrated are connected to different terminals, the partial circuits integrated are analyzed while being regarded to be connected to either of the destinations to which they were originally connected. The results of analysis are handled in relation to the different terminals. Thus, the operational characteristics of the partial circuits are analyzed.

According to the method or apparatus for carrying out circuit simulation in accordance with the fundamental embodiment of the present invention, the influence of an external terminal of extracted partial circuits to be assessed as the frequency of shifting from the source or drain of a MOS semiconductor device to the gate thereof in the course of tracing a path linking the external terminal to an object terminal is taken into consideration. The partial circuits are then inspected for equivalence. Consequently, integrating a plurality of partial circuits into one circuit readily, which cannot be achieved according to a known technique, can be achieved readily. As a result, a circuit to be simulated can be compressed more effectively. The scale of the circuit to be simulated can be reduced sufficiently. Thus, simulation of a circuit can be carried out at a relatively high speed.

Referring to FIGS. 5 to 14, a preferred embodiment of the present invention will be described. The same reference numerals will be assigned to components identical to those described previously.

Figure 5:
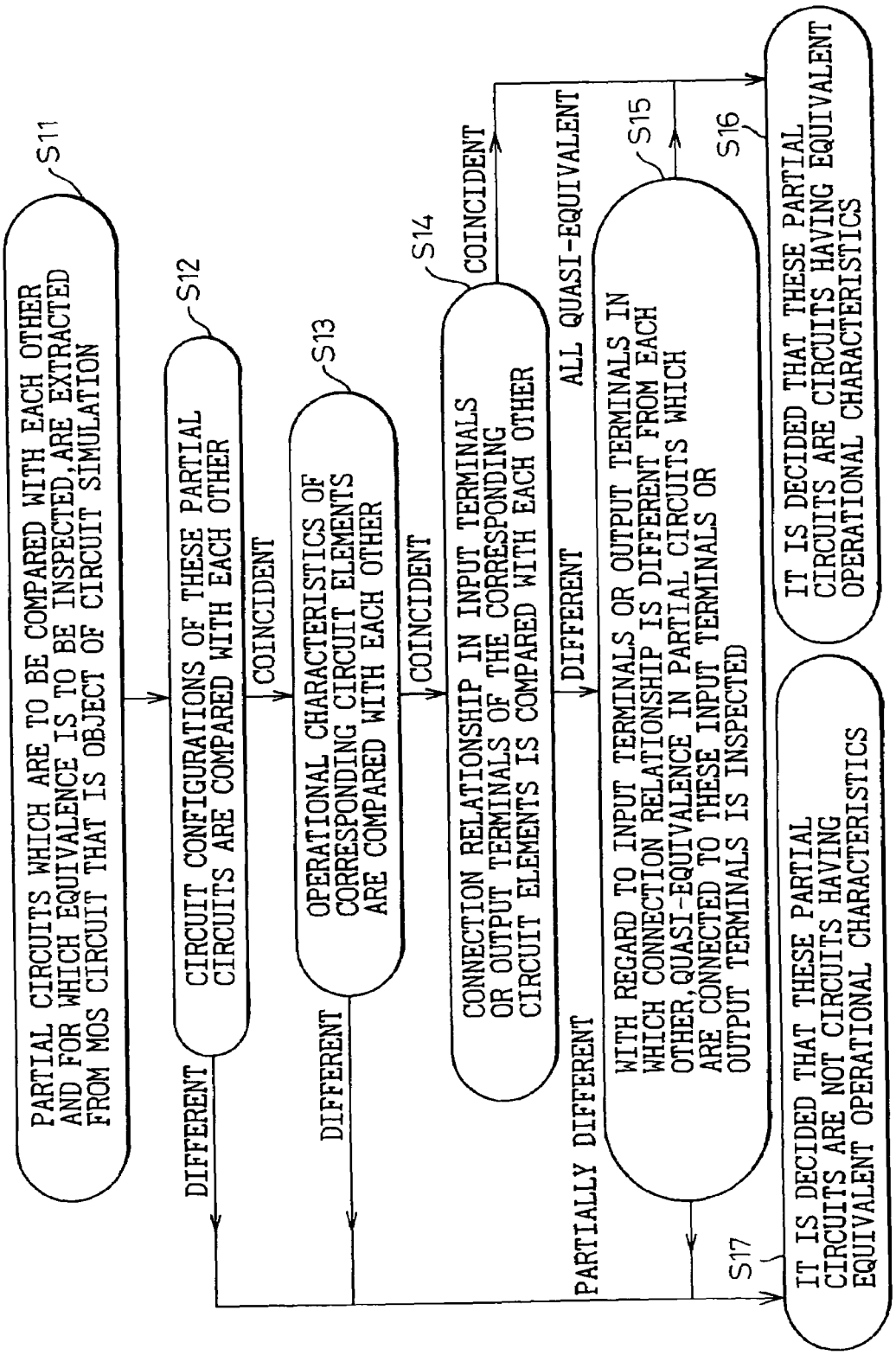
FIG. 5 is a flowchart describing an algorithm, according to which two partial circuits are inspected for equivalence in operation, employed in a method for carrying out circuit simulation in accordance with a preferred embodiment of the present invention.

FIG. 5 is a flowchart describing an algorithm, according to which two partial circuits are inspected for equivalence in operation, employed in a method for carrying out circuit simulation in accordance with a preferred embodiment of the present invention.

FIG. 5 describes an example of an algorithm used to inspect two partial circuits for equivalence. First, partial circuits to be inspected for equivalence through comparison are extracted from a circuit that is an object of circuit simulation (step S11). Every time partial circuits to be inspected through comparison are extracted, the processing of step 11 is repeated. First, the configurations of the two partial circuits (that is, what kinds of circuit elements are interconnected) are compared with each other (step S12). If the configurations are even partly inconsistent with each other, it is judged that the partial circuits have no equivalence between them (step S17). By contrast, when the configurations of two partial circuits are perfectly consistent with each other, control is passed to step S13. At step S13, the configurations of the two partial circuits are compared with each other, the operational characteristics of the corresponding circuit elements are compared with each other. If the operational characteristics of the circuit elements are mutually inconsistent, the operational characteristics of the partial circuits including the circuit elements are judged not to be equivalent to each other (step S17).

If all pairs of corresponding circuit elements have the same operational characteristics, at least ones of the input terminals and output terminals (hereinafter abbreviated to input or output terminals) of the partial circuits including the circuit elements are compared with each other (step S14). Step S14 is a step of judging whether or not corresponding input or output terminals are identical to each other. If corresponding input or output terminals are mutually identical, it is judged that the operational characteristics of the partial circuits being compared with each other are equivalent to each other (step S16).

In contrast, if mutually-different input or output terminals are present, it is judged whether or not partial circuits connected to the input or output terminals (however, partial circuits inspected for equivalence through comparison are excluded) are quasi-equivalent circuits, that is, the partial circuits connected to the input or output terminals are inspected for quasi-equivalence (step S15). When it is judged that partial circuits connected to all mutually-different input or output terminals are quasi-equivalent circuits, the partial circuits being inspected through comparison are judged to have equivalence between them (step S16). Otherwise, it is judged that the partial circuits have no equivalence between them (step S17).

Figure 6:
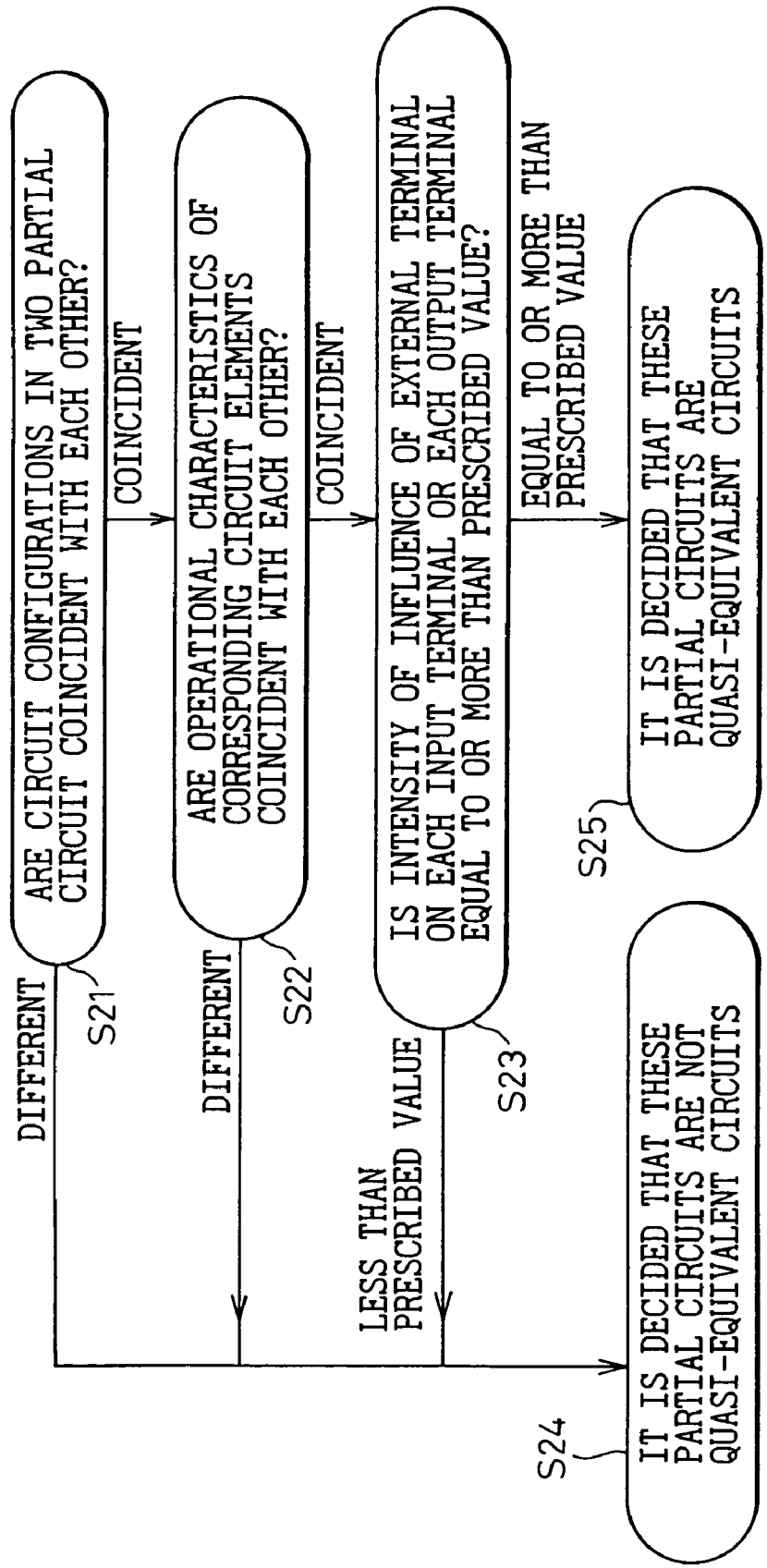
FIG. 6 is a flowchart describing an algorithm, according to which two partial circuits are inspected for quasi-equivalent in operation, employed in the method for carrying out circuit simulation in accordance with the preferred embodiment of the present invention.

FIG. 6 is a flowchart describing an algorithm, according to which two partial circuits are inspected for quasi-equivalence, employed in the method for carrying out circuit simulation in accordance with the preferred embodiment of the present invention.

In FIG. 6, for inspecting two partial circuits for quasi-equivalence in operation, first, the configurations of partial circuits to be compared with each other for quasi-equivalence are checked (step S21). As a result, if the configurations of the partial circuits are even partly mutually different, it is judged that the partial circuits are not quasi-equivalent to each other (step S24). If the configurations of the partial circuits are identical to each other, corresponding circuit elements are inspected in order to check if the operational characteristics thereof are identical to each other (step S22). If even one circuit element exhibits different operational characteristics, the partial circuits are judged not to be quasi-equivalent to each other (step S24). In contrast, as a result of comparing the operational characteristics of all circuit elements, if the operational characteristics are judged to be mutually identical, the control flow is passed to step S23. At step S23, the intensity of influence of an external terminal of circuits being inspected for quasi-equivalence upon input or output terminals that are determinants of judgment of quasi-equivalence are calculated (step S23). If the intensity of influence are equal to or larger than a prescribed value, it is judged that the two partial circuits have quasi-equivalence between them (step S25). Otherwise, it is judged that the two partial circuits have no quasi-equivalence between them (step S24).

Figure 7:
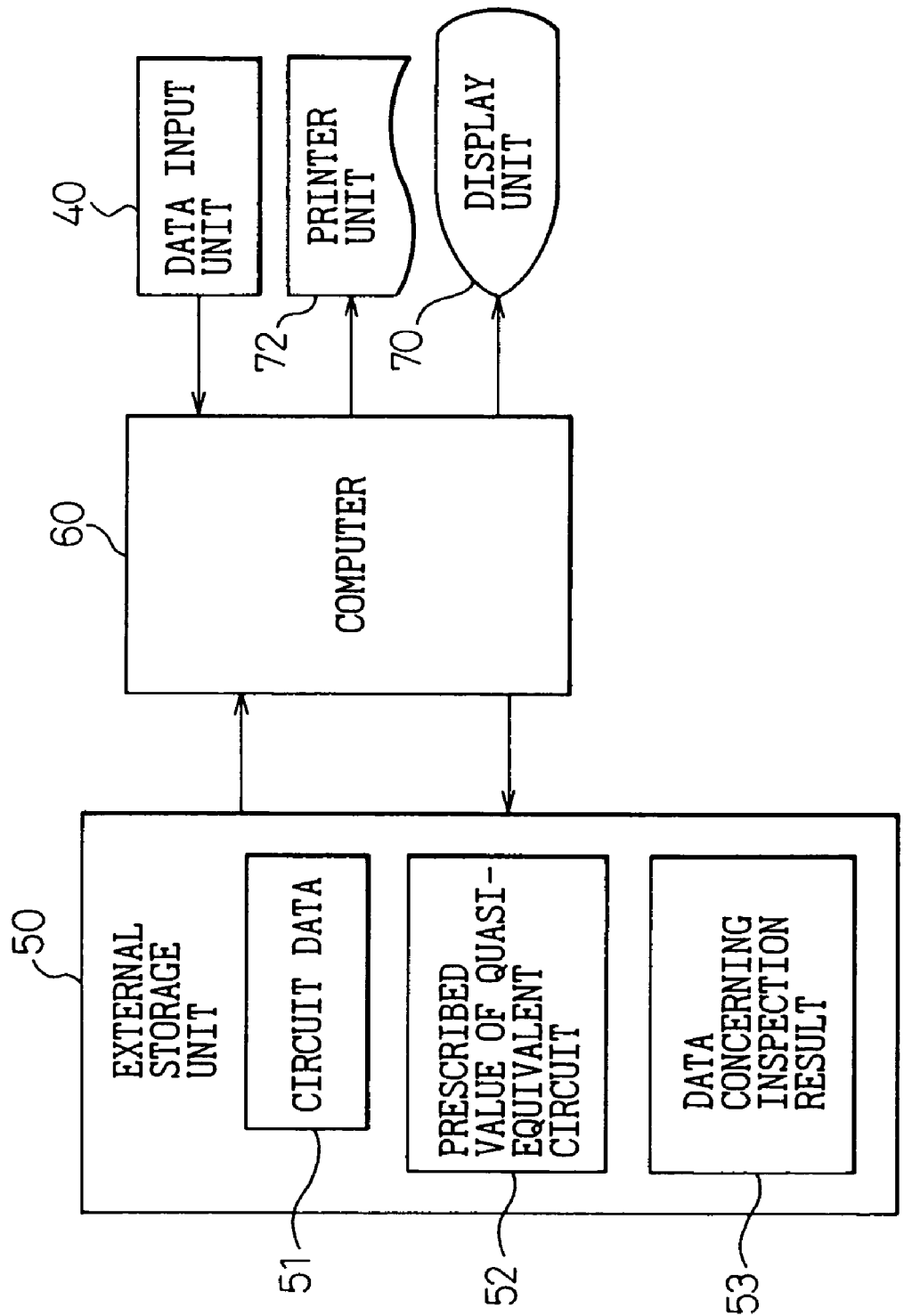
FIG. 7 is a block diagram showing the configuration of an apparatus for carrying out circuit simulation in accordance with the preferred embodiment of the present invention.

FIG. 7 is a block diagram showing the configuration of an apparatus for carrying out circuit simulation in accordance with the preferred embodiment of the present invention. A computer system including a computer and external storage unit is shown as a practical example of the apparatus for carrying out circuit simulation based on the principle of the present invention shown in FIG. 4.

In the preferred embodiment shown in FIG. 7, the control unit 6, circuit extracting unit 1, circuit-equivalence inspecting circuit 2, connected-circuit quasi-equivalence inspecting unit 3, and assessing unit for assessing the intensity of influence of an external terminal of a circuit to be simulated are realized with a computer 60 including a CPU.

Referring to FIG. 7, the storage unit 5 shown in FIG. 3 is realized with an external storage unit 50 such as a magneto-optical disk unit or magnetic disk unit. The external storage unit 50 holds circuit data 51 concerning the configurations of a plurality of partial circuits, the connectional relationships of corresponding input or output terminals of the plurality of partial circuits, and the operational characteristics of corresponding circuit elements of the plurality of partial circuits, a prescribed value 52 concerning quasi-equivalent circuits such as a value indicating the intensity of the influence of an external terminal, and data concerning inspection result 53 which indicates the presence or absence of equivalence or quasi-equivalence.

In FIG. 7, there is shown a data input unit 40 as an example of the data input unit 4 shown in FIG. 3. The data input unit 40 has the ability to input data concerning the configurations of a plurality of partial circuits, the connectional relationships of corresponding input or output terminals of the plurality of partial circuits, and the operational characteristics of corresponding component elements of the plurality of partial circuits, and a prescribed value concerning quasi-equivalent circuits into the computer 60.

In FIG. 7, there are shown a display unit 70 for displaying the results of inspecting a plurality of partial circuits for equivalence in a screen as a substitute for the output display unit 7 shown in FIG. 3, and a printer unit 72 for printing and displaying the results of inspecting a plurality of partial circuits for equivalence.

In the embodiment, the CPU in the computer 60 operates at high speed so as to inspect partial circuits for equivalence or quasi-equivalence in operation according to the algorithm described in FIG. 5 or 6.

Figure 8:
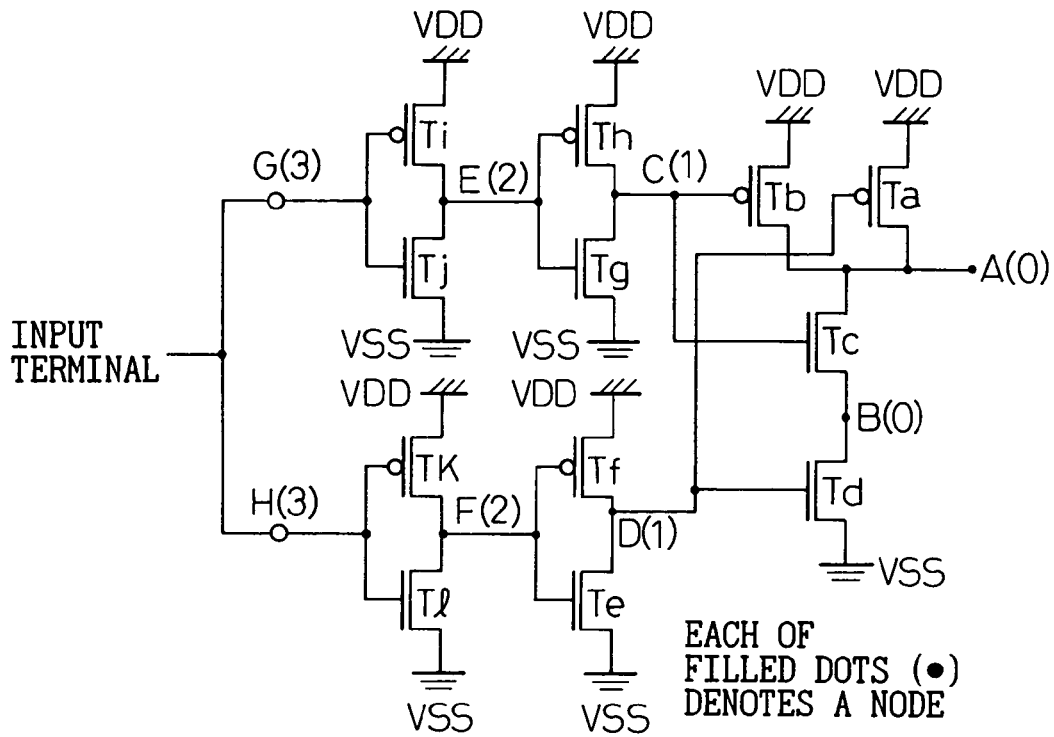
FIG. 8 is a circuit diagram for explaining the intensity of influence of an external terminal upon terminals.

FIG. 8 is a circuit diagram for explaining the intensity of the influence of an external terminal upon terminals. Herein, a logic circuit composed of a plurality of PMOS transistors and NMOS transistors exhibiting the same operational characteristics is shown as an example of a circuit that is an object of circuit simulation.

In FIG. 8, there are shown terminals A to H. Also shown are PMOS transistors Ta, Tb, Tf, Th, Ti, and Tk, and NMOS transistors Tc, Td, Te, Tg, Tj, and Tl. Filled dots in FIG. 8 indicate nodes joining different circuit elements.

In FIG. 8, the intensities of the influence of the external terminal A of the circuit to be simulated upon the terminals are indicated. Specifically, numerical values in parentheses appended to the terminal names in FIG. 8 indicate the intensity of influence upon the terminals. For example, when it comes to the terminal E, a path linking the terminal A serving as an external terminal and the terminal E is A to Tb to C to Th to E. Along the path, the frequency of shifting from the source or drain of a MOS transistor to the gate thereof is two. The intensity of influence upon the terminal E is therefore 2. If there are a plurality of paths, the smallest intensity of influence is defined as the intensity of influence upon a terminal concerned.

Figure 9:
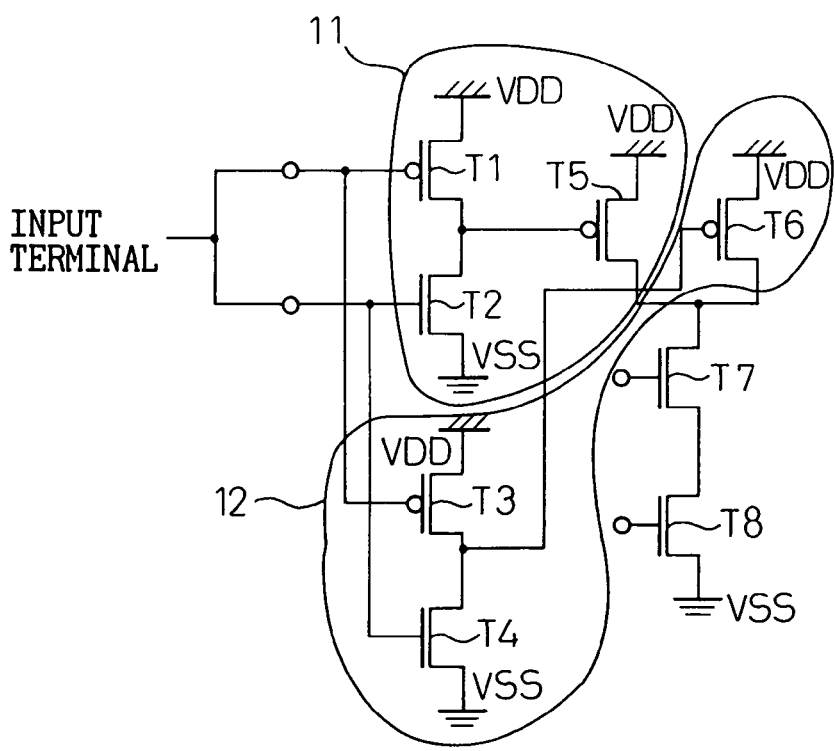
FIG. 9 is a circuit diagram showing the first example of a circuit whose partial circuits are judged as equivalent circuits according to the algorithm described in FIG. 5.

FIG. 9 is a circuit diagram showing the first example of a circuit whose partial circuits are judged as equivalent circuits according to the algorithm described in FIG. 5.

Herein, a logic circuit composed of four PMOS transistors T1, T3, T5, and T6, and four NMOS transistors T2, T4, T7, and T8 is shown as an example of a circuit that is an object of circuit simulation. Even in this case, the PMOS transistors and NMOS transistors all exhibit the same operational characteristics. Moreover, two signals to be input to a first partial circuit 11 and second partial circuit 12 through an input terminal have the same waveform.

FIG. 9 shows an example of a circuit including the first partial circuit 11 and second partial circuit 12 which are judged to exhibit equivalent operational characteristics. Specifically, when corresponding input or output terminals of the two partial circuits 11 and 12 are compared with each other, it is recognized that the corresponding input or output terminals are identical to each other. Finally, the operational characteristics of the two partial circuits 11 and 12 are judged to be equivalent to each other.

Figure 10:
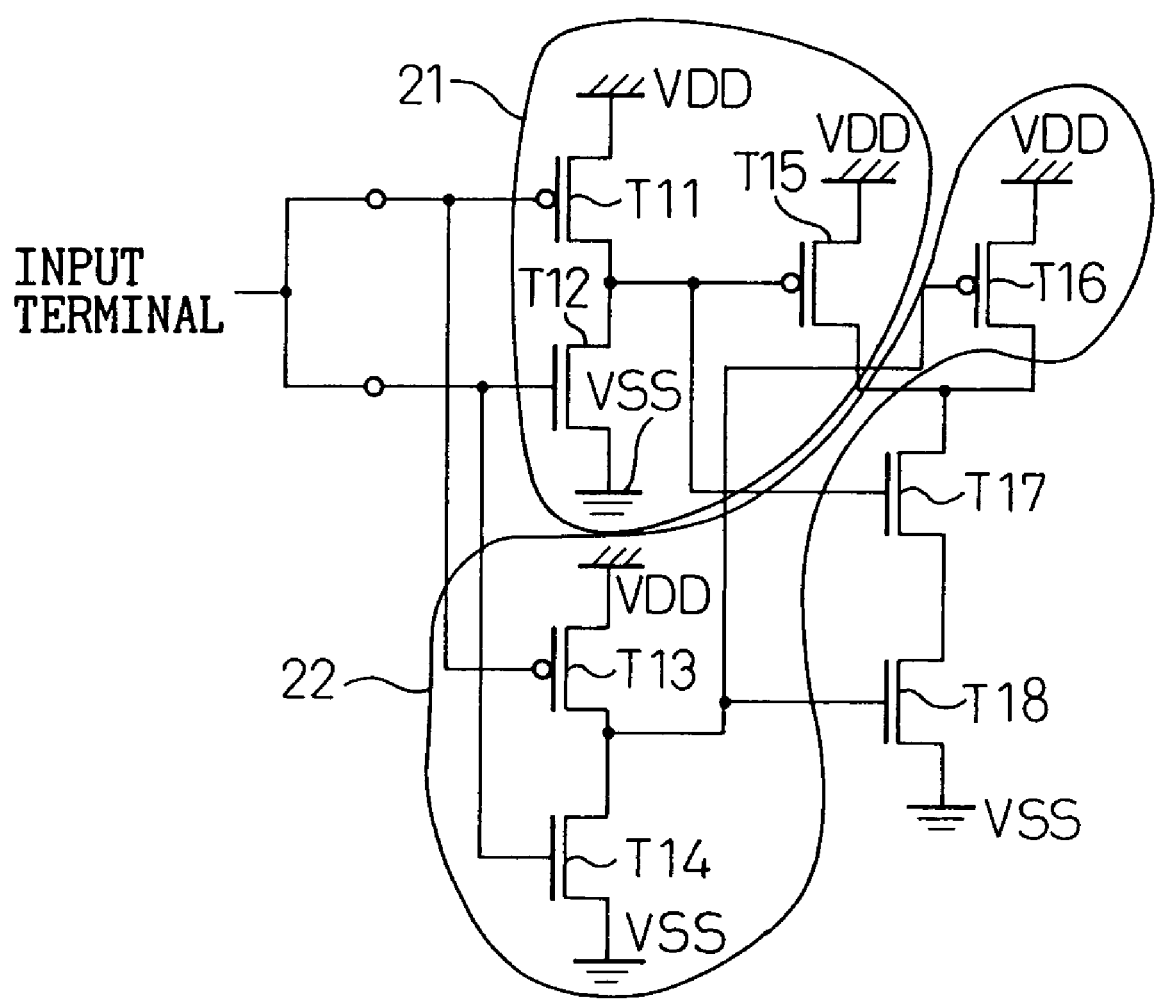
FIG. 10 is a circuit diagram showing an example of a circuit whose partial circuits are not judged as equivalent circuits according to the algorithm described in FIG. 5.

FIG. 10 is a circuit diagram showing an example of a circuit whose partial circuits are not judged as equivalent circuits according to the algorithm described in FIG. 5.

Herein, a logic circuit composed of four PMOS transistors T11, T13, T15, and T16 and four NMOS transistors T12, T14, T17, and T18 is shown as an example of a circuit that is an object of circuit simulation. Even in this case, the PMOS transistors and NMOS transistors all exhibit the same operational characteristics. Moreover, two signals to be input to a first partial circuit 21 and second partial circuit 22 through an input terminal have the same waveform.

FIG. 10 shows an example of a circuit whose first partial circuit 21 and second partial circuit 22 are judged not to exhibit mutually equivalent operational characteristics. Specifically, when corresponding input or output terminals of the two partial circuits 21 and 22 are compared with each other, it is recognized that the output terminals of the two partial circuits 21 and 22 are connected to different NMOS transistors T17 and T18. It is therefore judged that the operational characteristics of the two partial circuits 21 and 22 are not equivalent.

Figure 11:
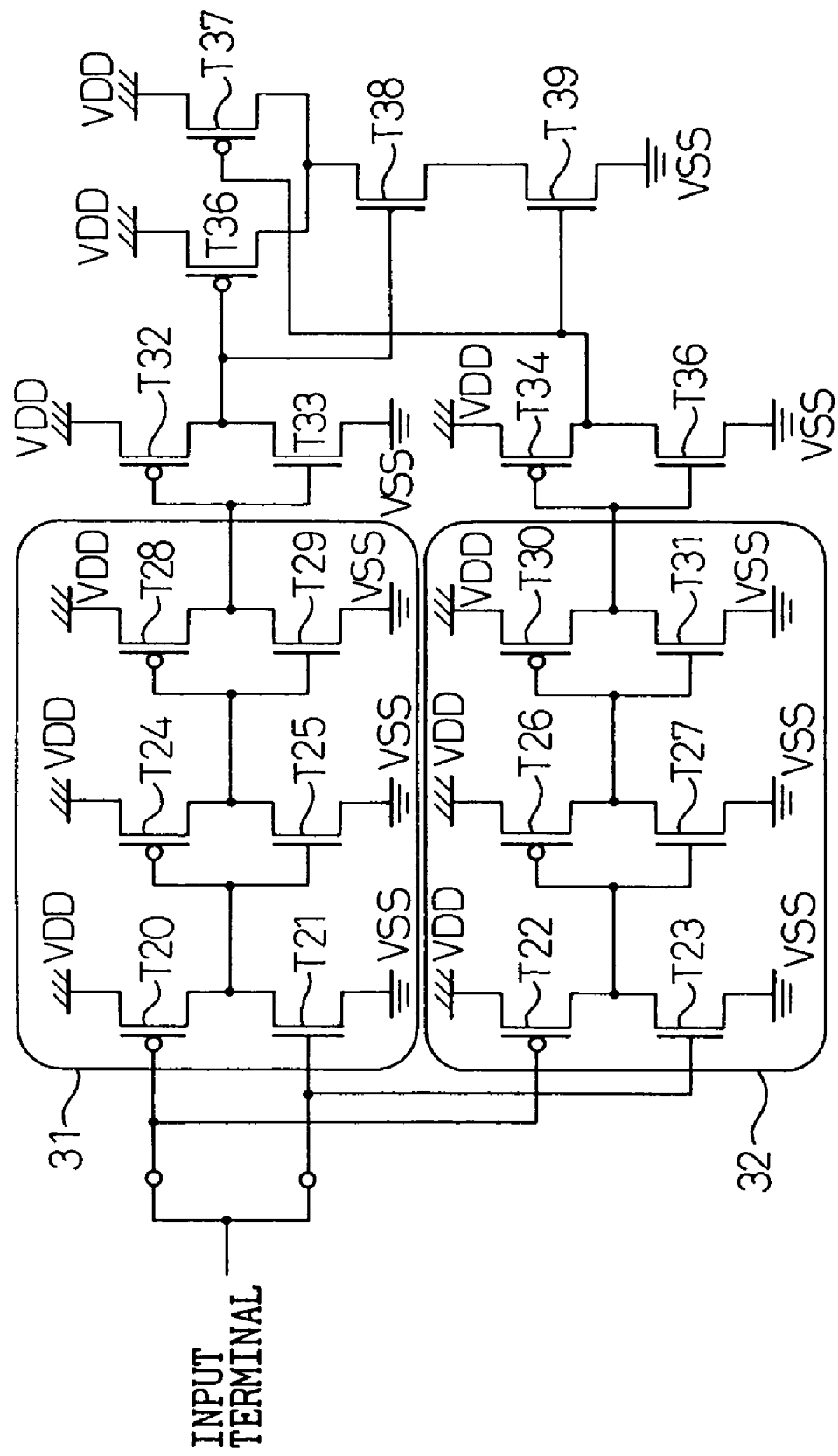
FIG. 11 is a circuit diagram showing the second example of a circuit whose partial circuits are judged as equivalent circuits according to the algorithm described in FIG. 5.

FIG. 11 is a circuit diagram showing a second example of a circuit whose partial circuits are judged as equivalent circuits according to the algorithm described in FIG. 5.

Herein, a logic circuit composed of ten PMOS transistors and ten NMOS transistors (T20 to T39) is shown as an example of a circuit that is an object of circuit simulation. Even in this case, the PMOS transistors and NMOS transistors all exhibit the same operational characteristics. Furthermore, two signals to be input to a first partial circuit 31 and second partial circuit 32 have the same waveform.

FIG. 11 shows an example of a circuit whose first partial circuit 31 and second partial circuit 32 exhibit mutually equivalent operational characteristics. Specifically, when corresponding input or output terminals of the two partial circuits 31 and 32 are compared with each other, it is recognized that the corresponding input or output terminals are identical to each other. It is therefore judged that the operational characteristics of the two partial circuits 31 and 32 are equivalent to each other.

Figure 12:
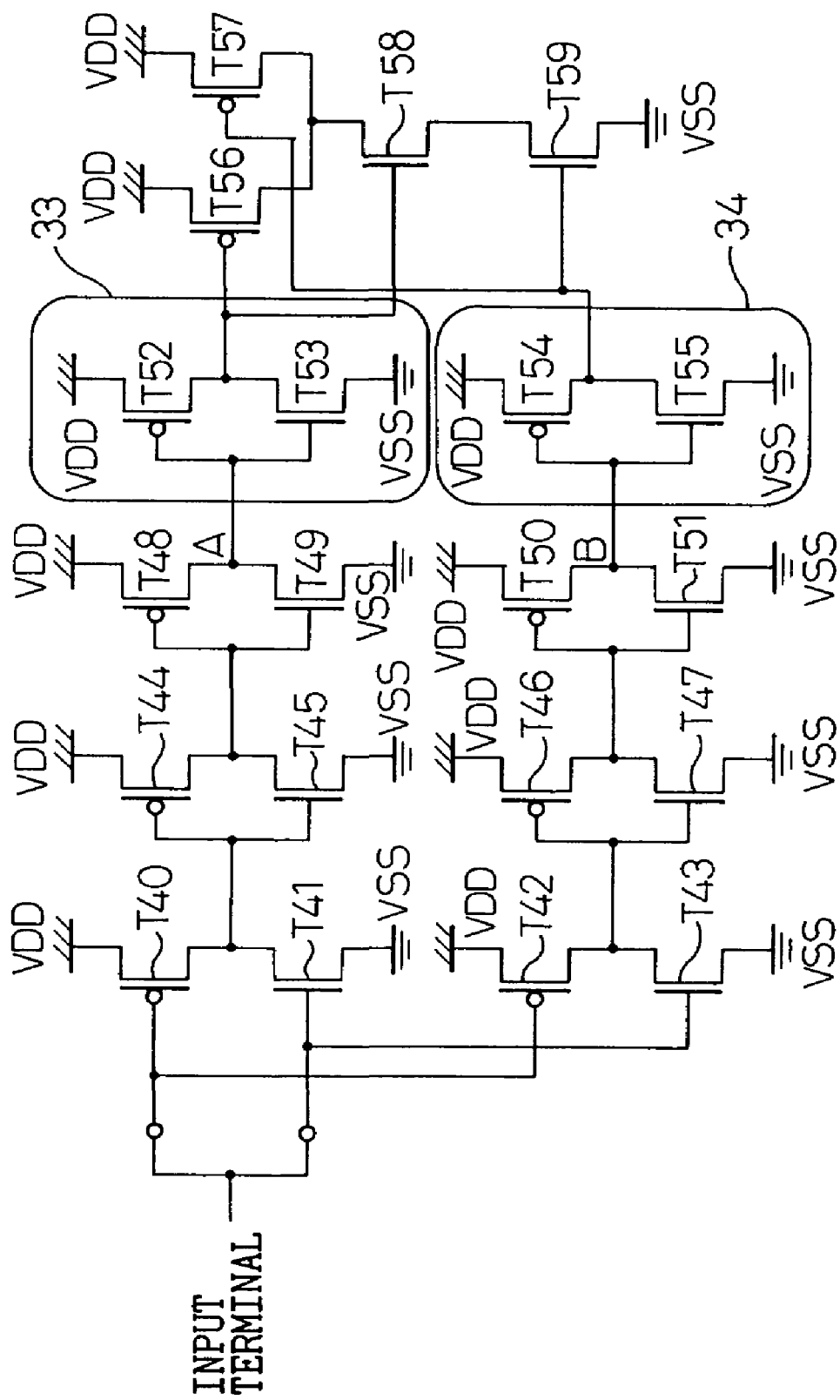
FIG. 12 is a circuit diagram showing an example of a circuit whose partial circuits are judged as quasi-equivalent circuits according to the algorithm described in FIG. 6.

FIG. 12 is a circuit diagram showing an example of a circuit whose partial circuits are judged as quasi-equivalent circuits according to the algorithm described in FIG. 6.

Herein, a logic circuit composed of ten PMOS transistors and ten NMOS transistors (T40 to T59) is, like the one in FIG. 11, shown as an example of a circuit that is an object of circuit simulation. Even in this case, the PMOS transistors and NMOS transistors all exhibit the same operational characteristics. Moreover, two signals to be placed on two lines through an input terminal have the same waveform.

In the circuit to be simulated shown in FIG. 12, a prescribed value indicating the intensity of the influence upon a quasi-equivalent circuit is set to 2. FIG. 12 shows an example of a circuit whose first partial circuit 33 and second partial circuit 34 are judged as quasi-equivalent circuits. In the example shown in FIG. 12, the output destination through a terminal A of one equivalent circuit composed of PMOS transistors T40, T44, and T48 and NMOS transistors T41, T45, and T49 is different from the output destination through a terminal B of the other equivalent circuit composed of PMOS transistors T42, T46, and T50 and NMOS transistors T43, T47, and T51. According to the algorithm described in FIG. 6, it is recognized that the configurations of the output destinations that are partial circuits (that is, the first partial circuit 33 and second partial circuit 34) and the operational characteristics of corresponding circuit elements are mutually identical. The mutually different connectional relationships of corresponding input or output terminals of the first partial circuit 33 and second partial circuit 34 are connections to NMOS transistors T58 and T59. The intensity of the influence of the NMOS transistors T58 and T59 upon the terminals A and B are 2 that is equal to the prescribed value. Consequently, the first partial circuit 33 and second partial circuit 34 are judged as quasi-equivalent circuits. Eventually, it is judged that the operational characteristics of partial circuits in FIG. 12 corresponding to the first partial circuit 31 and second partial circuit 32 shown in FIG. 11 are equivalent to each other.

Figure 13:
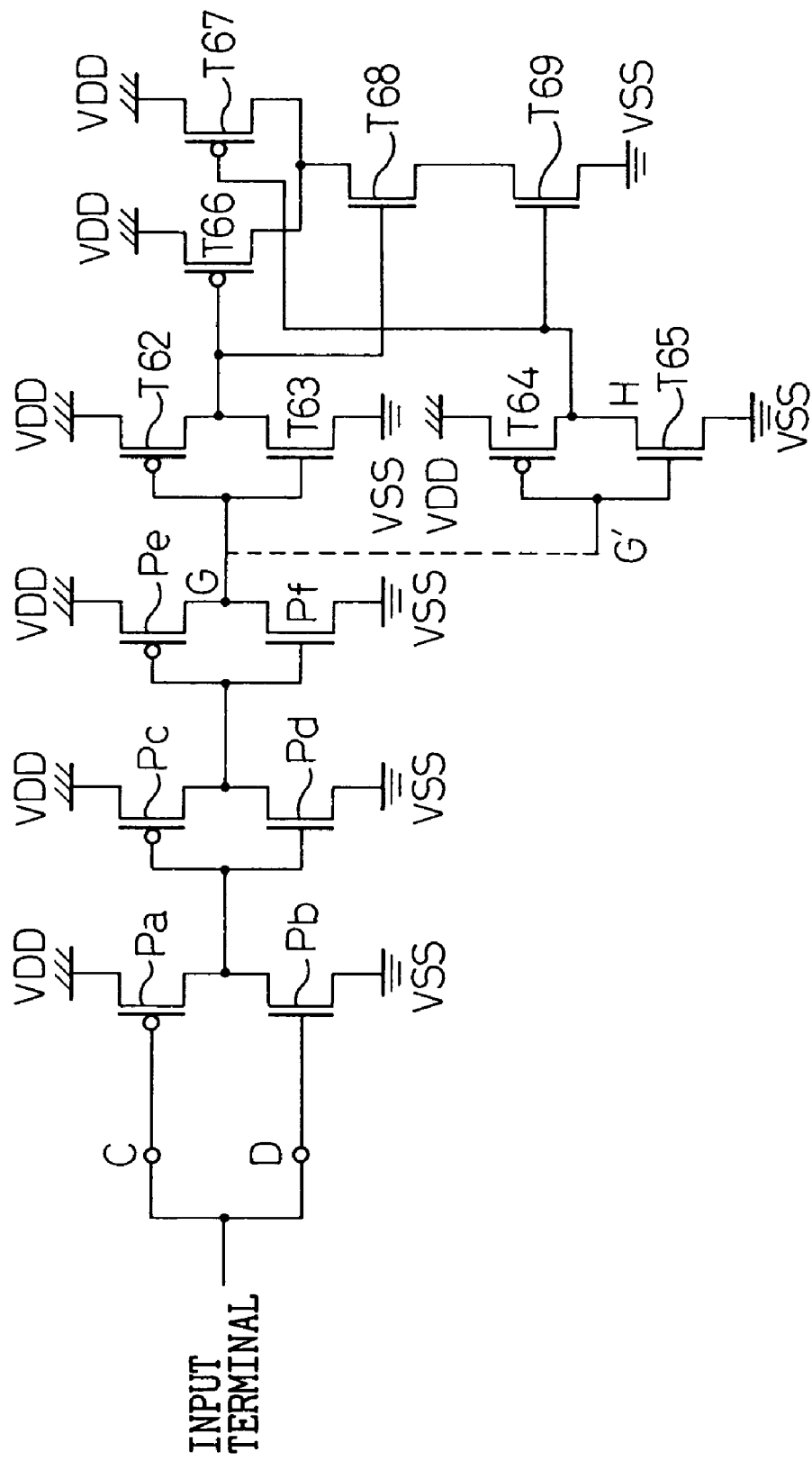
FIG. 13 is a circuit diagram showing the configuration of a compressed form of the circuit shown in FIG. 11.

FIG. 13 is a circuit diagram showing the configuration of a compressed form of the circuit shown in FIG. 11.

Herein, a compressed partial circuit is composed of three PMOS transistors Pa, Pc, and Pe and three NMOS transistors Pb, Pd, and Pf. That is to say, the numbers of circuit elements of the first partial circuit 31 and first partial circuit 32 shown in FIG. 11 are compressed to a half. Aside from the above MOS transistors, the circuit shown in FIG. 13 includes four PMOS transistors and four NMOS transistors (T62 to T69).

Circuit simulation is performed on a compressed circuit similar to the one shown in FIG. 13. In this case, it should be noted that compressed partial circuits are handled differently from a normal circuit. When the partial circuits are analyzed in relation to a terminal C, calculation is carried out with a current flowing from the PMOS transistor Pa doubled (comparable to the number of circuit elements compressed). The same applies to a terminal D. When the partial circuits are analyzed in relation to a terminal G, the connection between the terminal G and a terminal G', which is drawn with a dashed line in FIG. 13, is regarded as not being made. When the partial circuits are analyzed in relation to a terminal H, the terminal G' is handled as if it were the terminal G. Thus, the compressed circuit is simulated.

FIG. 14 is a flowchart describing an algorithm, according to which a circuit element and terminal are inspected for uniqueness, employed in the method for carrying out circuit simulation in accordance with a preferred embodiment of the present invention. Herein, circuit elements constituting a circuit to be simulated shall be referred to simply as elements.

According to the algorithm described in FIG. 14, first, a unique element is detected (step S31). For example, a power supply that operates uniquely is a unique element. If there is a counterpart that operates in the same manner as the power supply, these power supplies are integrated into one power supply. The power supply is then handled as a unique element. When a unique element is detected, terminals connected to the detected element are inspected to see if the terminals have been judged to be unique (step S32). If there is a terminal that has not been judged to be unique, the terminal is newly judged as a unique terminal (step S33).

When all the terminals connected to all elements that have been judged to be unique are judged to be unique, the processing is terminated (step 37). In contrast, as far as a terminal newly judged to be unique is concerned, partial circuits connected to the terminal are inspected for equivalence in operational characteristics (step S34). If the operational characteristics of the partial circuits are judged to be equivalent to each other, compression is carried out in order to integrate the partial circuits into one circuit (step S35). After the compression is completed, elements connected to the terminal that is judged to be unique are newly judged to be unique (step S36). By repeating this sequence, the uniqueness of an element and terminal is judged and a circuit is compressed.

As described so far, according to the fundamental embodiment and preferred embodiment of the present invention, first, the intensity of influence of an external terminal of partial circuits extracted from a circuit to be simulated is assessed by tracing paths linking the external terminal and object terminals. The partial circuits are thus inspected for equivalence. Integrating a plurality of partial circuits into one circuit, which cannot be achieved according to a known technique, can be achieved readily. The circuit to be simulated can be compressed effectively and reduced sufficiently in scale. Consequently, circuit simulation can be carried out at a relatively high speed.

According to the fundamental embodiment and preferred embodiment of the present invention, second, the frequency of shifting from the source or drain of a MOS semiconductor device to the gate thereof in the course of tracing a path linking an external terminal and an object terminal is assessed as the intensity of influence of the external terminal. Partial circuits can therefore be inspected for equivalence with higher precision than they can be inspected according to a related art. Consequently, a large-scale circuit such as a MOS LSI circuit can be compressed effectively. The time required for simulation of a MOS LSI circuit or the like is shortened drastically. Eventually, circuit simulation can be carried out at high speed.

According to the fundamental embodiment and preferred embodiment of the present invention, third, when the connectional relationships of corresponding input or output terminals of a plurality of partial circuits to be inspected for equivalence are judged to be mutually inconsistent, a plurality of other partial circuits connected to the input or output terminals are inspected for quasi-equivalence. Based on the results of quasi-equivalence inspection, the partial circuits to be inspected for equivalence can be inspected for equivalence quickly and accurately. Consequently, the time required for compressing a circuit to be simulated can be shortened drastically.

According to the fundamental embodiment and preferred embodiment of the present invention, fourth, when partial circuits are inspected for equivalence, a unique element having no counterpart within a circuit to be simulated is detected, and a unique terminal is distinguished from terminals connected to the unique element. Partial circuits other than a partial circuit including a circuit element that is recognized as a unique element can be extracted readily as partial circuits which need to be inspected for equivalence.

What is claimed is:

1. A method of carrying out simulation of a circuit, comprising:
    inputting data comprising configurations for a plurality of partial circuits, and connectional relationships for input and output terminals of the partial circuits;
    extracting, from the circuit to be simulated, the plurality of partial circuits to inspect for equivalent operational characteristics;
    inspecting the plurality of partial circuits to detect partial circuits exhibiting equivalent operational characteristics, based on the configurations of the plurality of partial circuits, and judging equivalence when the configurations of said plurality of partial circuits are mutually consistent; and
    compressing the circuit by reducing the partial circuits exhibiting equivalent operational characteristics into one partial circuit and simulating the compressed circuit.

2. The method of claim 1, wherein said inspecting the plurality of partial circuits is based on the connectional relationships of at least one of the corresponding input terminals and output terminals of the plurality of partial circuits.

3. The method of claim 1, wherein said inspecting the plurality of partial circuits is based on the operational characteristics of corresponding component elements of the plurality of partial circuits.

4. The method of claim 1, wherein the circuit to be simulated is a MOS circuit comprising a plurality of MOS semiconductor devices.

5. The method of claim 1, further comprising judging non-equivalence when the configurations of the plurality of partial circuits are mutually inconsistent.

6. The method of claim 1, further comprising assessing the intensity of influence of an external terminal of the circuit by tracing paths linking the external terminal and one or more terminals of the plurality of partial circuits.

7. The method of claim 6, wherein said inspecting the plurality of partial circuits is based on the intensity of the influence of the external terminal.

8. The method of claim 6, wherein the circuit to be simulated is a MOS circuit comprising a plurality of MOS semiconductor devices.

9. The method of claim 1, wherein said assessing the intensity of influence of an external terminal is determined as the frequency of shifting from the source or drain of a MOS semiconductor device to the gate thereof while tracing a path linking the external terminal and a given terminal of each of the plurality of partial circuits.

10. The method of claim 1, wherein when the connectional relationships of at least one of the corresponding input terminals and output terminals of the plurality of partial circuits are judged to be mutually inconsistent, a plurality of other partial circuits connected to at least one of the corresponding input terminals and output terminals are inspected for quasi-equivalent circuits, and when the plurality of other partial circuits are judged as quasi-equivalent circuits, the plurality of partial circuits are regarded as exhibiting equivalent operational characteristics.

11. The method of claim 1, wherein when the plurality of partial circuits are inspected for equivalence, a unique element having no counterpart within the circuit to be simulated is detected, and if a terminal that has not been judged to be a unique terminal having no counterpart is included in the terminals connected to the unique element, the terminal is newly judged to be a unique terminal, and the plurality of partial circuits connected to the newly judged unique terminal are inspected for equivalence.

12. A system for carrying out simulation of a circuit, comprising:
    a data input unit inputting data comprising configurations for a plurality of partial circuits, and connectional relationships for input and output terminals of the partial circuits;
    a circuit extracting unit extracting, from the circuit to be simulated, the plurality of partial circuits to inspect for equivalent operational characteristics;
    a storage unit holding data concerning configurations of the plurality of partial circuits; and
    a circuit equivalence inspecting unit detecting partial circuits exhibiting equivalent operational characteristics by inspecting the plurality of partial circuits on the basis of the configurations of the plurality of partial circuits, and having a judging unit judging equivalence when the configurations of said plurality of partial circuits are mutually consistent,
    wherein the circuit to be simulated is compressed by reducing the partial circuits exhibiting equivalent operational characteristics into one partial circuit and circuit simulation is performed on the compressed circuit.

13. The system of claim 12, wherein said storage unit holds data concerning the connectional relationships of at least one of the corresponding input terminals and output terminals of the plurality of partial circuits, and said circuit-equivalence inspecting unit detects partial circuits on the basis of the connectional relationships of at least one of the corresponding input terminals and output terminals of the plurality of partial circuits.

14. The system of claim 12, wherein said storage unit holds data concerning the operational characteristics of corresponding component elements of the plurality of partial circuits, and said circuit-equivalence inspecting unit detects partial circuits on the basis of the operational characteristics of corresponding component elements of the plurality of partial circuits.

15. The system of claim 12, wherein the circuit to be simulated is a MOS circuit comprising a plurality of MOS semiconductor devices.

16. The system of claim 12, wherein said circuit-equivalence inspecting unit further comprises a judging unit judging non-equivalence when the configurations of the plurality of partial circuits are mutually inconsistent.

17. The system of claim 12, further comprising an assessing unit assessing the intensity of influence of an external terminal of the circuit by tracing paths linking the external terminal and one or more terminals of the plurality of partial circuits.

18. The system of claim 17, wherein said circuit-equivalence inspecting unit detects partial circuits on the basis of the intensity of the influence of the external terminal.

19. The system of claim 17, wherein the circuit to be simulated is a MOS circuit comprising a plurality of MOS semiconductor devices.

20. The system claim 19, wherein the intensity of influence of said external terminal is determined as the frequency of shifting from the source or drain of a MOS semiconductor device to the gate thereof while tracing a path linking the external terminal and a given terminal of each of the plurality of partial circuits.

21. The system of claim 12, further comprising a connected-circuit quasi-equivalence inspecting unit inspecting, when said circuit-equivalence inspecting unit judges that the connectional relationship of at least one of the corresponding input terminals and output terminals of the plurality of partial circuits are mutually inconsistent, a plurality of other partial circuits connected to at least one of the corresponding input terminals and output terminals for quasi-equivalent circuits, wherein when said connected-circuit quasi-equivalence inspecting unit judges that the plurality of other partial circuits are quasi-equivalent circuits, the plurality of partial circuits are regarded as exhibiting equivalent operational characteristics.

22. The system of claim 12, wherein when the plurality of partial circuits are inspect for equivalence, said circuit-equivalence inspecting unit detects a unique element having no counterpart within the circuit to be simulated, and if a terminal that has not been judged to be a unique terminal having no counterpart is included in the terminals connected to the unique element, the terminal is newly judged to be a unique terminal, and the plurality of partial circuits connected to the newly judged unique terminal are inspected for equivalence.

23. An apparatus for carrying out simulation of a circuit, comprising:
a data input circuit inputting data comprising configurations for a plurality of partial circuits, and connectional relationships for input and output terminals of the partial circuits;
a circuit extracting circuit extracting, from the circuit to be simulated, the plurality of partial circuits to inspect for equivalent operational characteristics;
a storage circuit holding data concerning configurations of the plurality of partial circuits; and
a circuit-equivalent inspecting circuit detecting partial circuits exhibiting equivalent operational characteristics by inspecting the plurality of partial circuits on the basis of the configurations of the plurality of partial circuits, and having a judging circuit judging equivalence when the configurations of said plurality of partial circuits are mutually consistent,
wherein the circuit to be simulated is compressed by reducing the partial circuits exhibiting equivalent operational characteristics into one partial circuit and circuit simulation is performed on the compressed circuit.

24. The apparatus of claim 23, wherein said storage unit holds data concerning the connectional relationships of at least one of the corresponding input terminals and output terminals of the plurality of partial circuits, and said circuit-equivalence inspecting unit detects partial circuits on the basis of the connectional relationships of at least one of the corresponding input terminals and output terminals of the plurality of partial circuits.

25. The apparatus of claim 23, wherein said storage unit holds data concerning the operational characteristics of corresponding component elements of the plurality of partial circuits, and said circuit-equivalence inspecting unit detects partial circuits on the basis of the operational characteristics of corresponding component elements of the plurality of partial circuits.

26. The apparatus of claim 23, wherein the circuit to be simulated is a MOS circuit comprising a plurality of MOS semiconductor devices.

27. The apparatus of claim 23, wherein said circuit-equivalence inspecting unit further comprises a judging unit judging non-equivalence when the configurations of the plurality of partial circuits are mutually inconsistent.

28. The apparatus of claim 23, further comprising an assessing unit assessing the intensity of influence of an external terminal of the circuit by tracing paths linking the external terminal and one or more terminals of the plurality of partial circuits.

29. The apparatus of claim 28, wherein said circuit-equivalence inspecting unit detects partial circuits on the basis of the intensity of the influence of the external terminal.

30. The apparatus of claim 28, wherein the circuit to be simulated is a MOS circuit comprising a plurality of MOS semiconductor devices.

31. The apparatus of claim 30, wherein the intensity of influence of said external terminal is determined as the frequency of shifting from the source or drain of a MOS semiconductor device to the gate thereof while tracing a path linking the external terminal and a given terminal of each of the plurality of partial circuits.

32. The apparatus of claim 23, further comprising a connected-circuit quasi-equivalence inspecting unit inspecting, when said circuit-equivalence inspecting unit judges that the connectional relationship of at least one of the corresponding input terminals and output terminals of the plurality of partial circuits are mutually inconsistent, a plurality of other partial circuits connected to at least one of the corresponding input terminals and output terminals for quasi-equivalent circuits,
wherein when said connected-circuit quasi-equivalence inspecting unit judges that the plurality of other partial circuits are quasi-equivalent circuits, the plurality of partial circuits are regarded as exhibiting equivalent operational characteristics.

33. The apparatus of claim 23, wherein when the plurality of partial circuits are inspect for equivalence, said circuit-equivalence inspecting unit detects a unique element having no counterpart within the circuit to be simulated, and if a terminal that has not been judged to be a unique terminal having no counterpart is included in the terminals connected to the unique element, the terminal is newly judged to be a unique terminal, and the plurality of partial circuits connected to the newly judged unique terminal are inspected for equivalence.

* * * * *

UNITED STATES PATENT AND TRADEMARK OFFICE
CERTIFICATE OF CORRECTION

PATENT NO.         : 6,999,911 B2
APPLICATION NO. : 09/045041
DATED              : February 14, 2006
INVENTOR(S)       : Hisanori Fujisawa It is certified that error appears in the above-identified patent and that said Letters Patent is hereby corrected as shown below:

Column 17, Line 33, change "a given terminal" to -- one or more terminals --
Column 17, Line 64, delete "circuit extracting" second occurrence Signed and Sealed this Eighteenth Day of July, 2006

JON W. DUDAS
*Director of the United States Patent and Trademark Office*